(12) United States Patent
Bjørn

(10) Patent No.: US 7,646,192 B2
(45) Date of Patent: Jan. 12, 2010

(54) COMPENSATION OF SIMPLE FIBRE OPTIC FARADAY EFFECT SENSORS

(75) Inventor: Lars N. Bjørn, Brønshøj (DK)

(73) Assignee: Powersense A/S, KGS. Lyngby (DK)

( * ) Notice: Subject to any disclaimer, the term of this patent is extended or adjusted under 35 U.S.C. 154(b) by 0 days.

(21) Appl. No.: 11/972,832

(22) Filed: Jan. 11, 2008

(65) Prior Publication Data

US 2008/0164864 A1     Jul. 10, 2008

Related U.S. Application Data

(60) Division of application No. 11/382,656, filed on May 10, 2006, now Pat. No. 7,466,118, which is a division of application No. 10/849,507, filed on May 19, 2004, now Pat. No. 7,068,025, which is a continuation of application No. PCT/DK2004/000337, filed on May 12, 2004.

(60) Provisional application No. 60/471,551, filed on May 19, 2003.

(30) Foreign Application Priority Data

May 12, 2003   (EP)   ................................. 03010594

(51) Int. Cl.
  *G01R 19/00*   (2006.01)
  *G01R 33/032*   (2006.01)
(52) U.S. Cl. ...................... 324/96; 324/117 R; 359/281
(58) Field of Classification Search .................. 324/96, 324/117 R; 359/280–283, 324, 484
  See application file for complete search history.

(56) References Cited

U.S. PATENT DOCUMENTS

| 3,980,949 | A |   | 9/1976 | Feldtkeller |
| 4,683,421 | A |   | 7/1987 | Miller et al. |
| 4,894,608 | A |   | 1/1990 | Ulmer, Jr. |
| 4,947,107 | A |   | 8/1990 | Doerfler et al. |
| 4,999,571 | A | * | 3/1991 | Ishiko et al. ................. 324/96 |
| 5,051,577 | A |   | 9/1991 | Lutz et al. |
| 5,451,863 | A |   | 9/1995 | Freeman |
| 5,486,754 | A |   | 1/1996 | Cruden et al. |
| 5,811,964 | A |   | 9/1998 | Bosselmann et al. |

(Continued)

OTHER PUBLICATIONS

Non-Final Office Action on co-pending (U.S. Appl. No. 11/283,504) dated Sep. 16, 2008.

(Continued)

*Primary Examiner*—Ernest F Karlsen
(74) *Attorney, Agent, or Firm*—Klein, O'Neill & Singh, LLP

(57) ABSTRACT

An electric current measurement device includes a housing defining first and second open ends sealed by first and second sealing means, respectively: a first optical fiber received in an aperture in the first sealing means and in optical communication with a first optical lens in the housing; a first polarization filter in the housing in optical communication with the first lens; a magneto-optical rod within the housing in optical communication with the first polarization filter; a second polarization filter in the housing in optical communication with the rod; and a second optical lens in the housing in optical communication with the second polarization filter. The second sealing means has an aperture for receiving a second optical fiber fixed to the second lens. First and second lids, attachable to the first and second housing ends, respectively include apertures for receiving the first and second optical fibers, respectively.

11 Claims, 20 Drawing Sheets

U.S. PATENT DOCUMENTS

| | | |
|---|---|---|
| 6,025,980 A | 2/2000 | Morron et al. |
| 6,043,648 A | 3/2000 | Menke et al. |
| 6,630,819 B2 | 10/2003 | Lanagan et al. |
| 6,756,781 B2 | 6/2004 | Duncan et al. |
| 6,876,480 B2 * | 4/2005 | Sahashi et al. ............. 359/280 |

OTHER PUBLICATIONS

Final Office Action on co-pending (U.S. Appl. No. 11/283,504) dated Apr. 15, 2009.

* cited by examiner

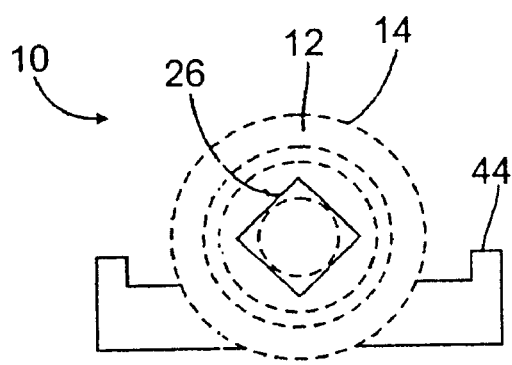
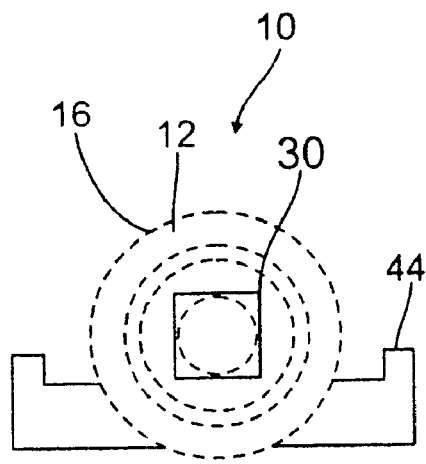
FIG. 4   FIG. 5
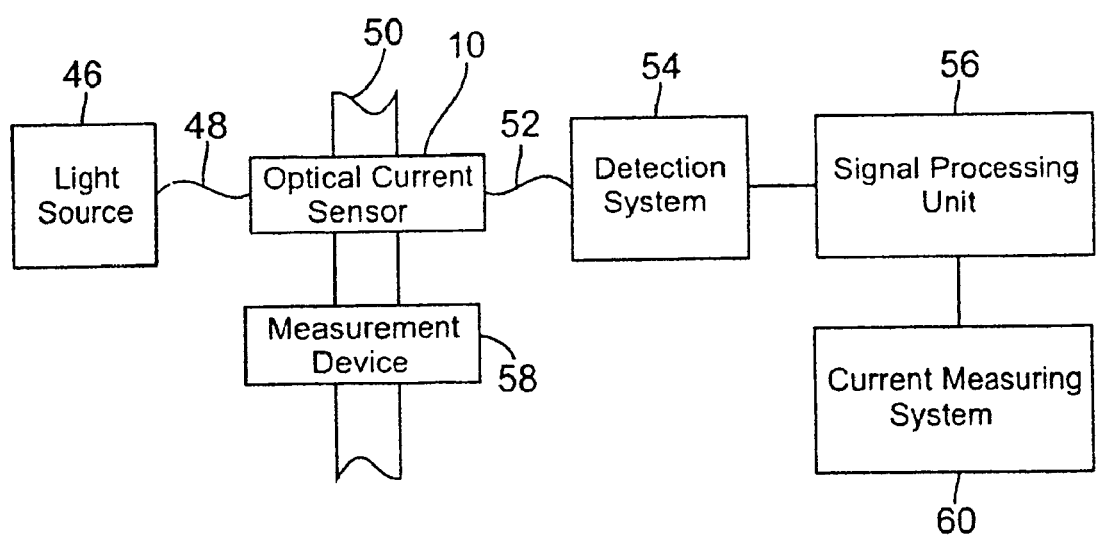
FIG. 6

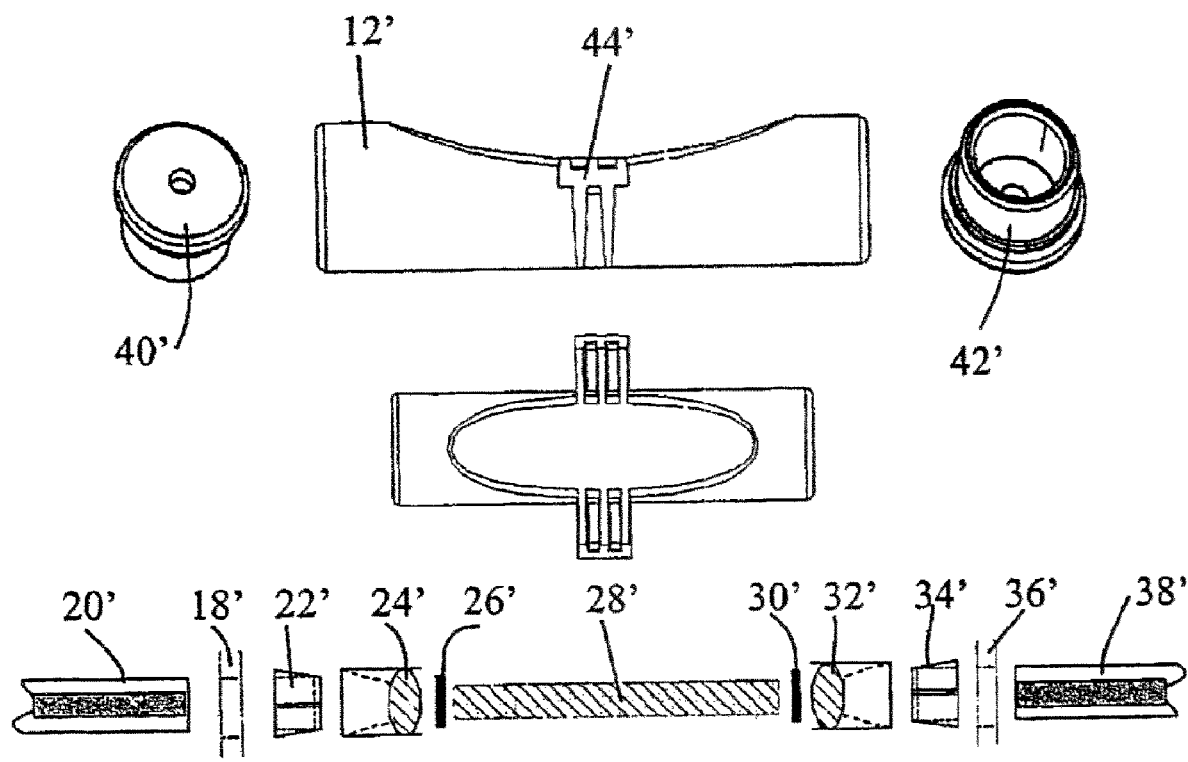
Fig 19
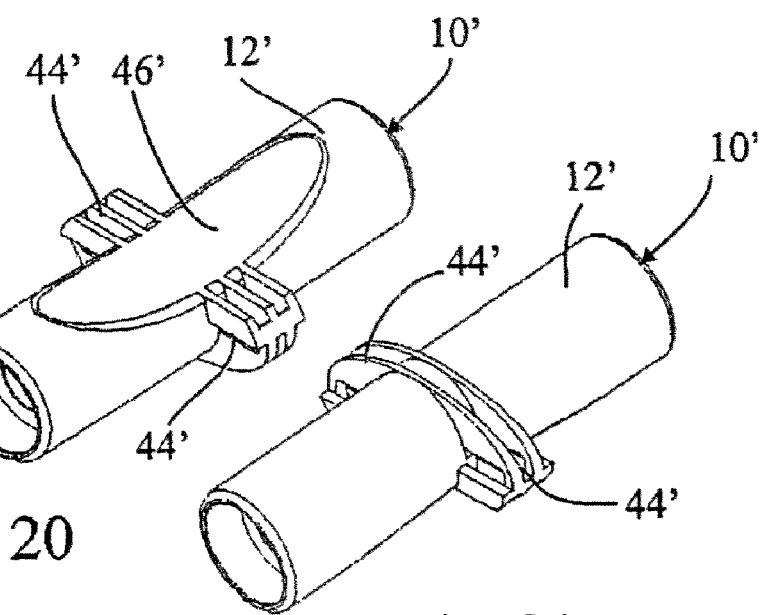
Fig. 20
Fig. 21

COMPENSATION OF SIMPLE FIBRE OPTIC FARADAY EFFECT SENSORS

CROSS-REFERENCE TO RELATED APPLICATIONS

This application is a divisional of application Ser. No. 11/382,656, filed May 10, 2006 now U.S. Pat. No. 7,466,118, which is a divisional of application Ser. No. 10/849,507, filed May 19, 2004, now U.S. Pat. No. 7,068,025, issued Jun. 27, 2006, which is a continuation of International Application No. PCT/DK2004/000337, filed May 12, 2004, which, in turn, claims the benefit, under 35 U.S.C. §119(e), of U.S. provisional application No. 60/471,551, filed May 19, 2003. The disclosures of all of these related applications are expressly incorporated herein by reference.

FEDERALLY-SPONSORED RESEARCH OR DEVELOPMENT

Not Applicable

BACKGROUND OF THE INVENTION

The invention relates to a Faraday optical current sensor with polarimetric detection. The present invention further relates to a method of calibrating a current sensor system including a Faraday optical current sensor.

The power industry has a need for monitoring transformer stations for power surges and measurement of large current pulses. For these purposes, a Faraday Effect current sensor has several advantages. A Faraday Effect current sensor may be constructed from dielectric materials, which is of grave importance when measuring at high currents in the presence of substantial electric magnetic interference. Faraday Effect current sensors may employ a coil of an optical fibre or a number of optical fibres, formed of a material exhibiting the Faraday Effect in response to a magnetic field generated by an electric current. A number of prior art patent publications describe Faraday optical current sensors, such as the US publications U.S. Pat. No. 4,894,608, U.S. Pat. No. 5,051,577, U.S. Pat. No. 5,486,754, U.S. Pat. No. 5,811,964, U.S. Pat. No. 6,043,648, all of which are hereby incorporated in the present specification by reference.

In a Faraday effect current sensor, the polarisation plane of a polarised incident light undergoes a rotation, which is a function of the magnetic field created by the electric current to be measured.

The current to be measured can be determined by determining the angle of rotation of the polarization plane of the light on output of the optical sensor. When the light passes through a glass rod the light undergoes a rotation. The angle of rotation may be described by the formula:

$$\beta = V \times B \times d$$

Where $\beta$ is the angle of rotation, d is the length of the sensing element, V is the Verdet constant of the glass rod, and B is the magnetic field described as a vector. The Verdet constant is both temperature and wavelength dependent.

In a Faraday Effect current sensor, a light source generates light, which is passed through a polarisation filter or otherwise polarised prior to travelling through the magneto-optical sensitive material. The polarised incident light undergoes a rotation, which is a function of the magnetic field created by the electrical current to be measured. The current to be measured may be determined by metering the angle of rotation of the polarisation plane of the light at the output of the Faraday optical current sensor.

The fibre optic current sensor including the light source and detector is sensitive to, among other things, optical noise in the detection circuit, electrical noise in light source, interference from magnetic fields from nearby inductors and systems, sensor mounting and setup, conductor shape and diameter, sensor production tolerances, temperature effect on Verdets constant, temperature effect on light source and detector, light source and detector degradation over the products lifetime The determination of the current to be measured is subject to a number of sources of error. Any system based on optics or electrical circuits is sensitive to noise and other signal degradations, such as optical noise or interference from electromagnetic sources. A system comprising a light source, a light detection unit and an optical conduit such as an optical fibre may suffer loss of sensitivity due to optical dampening caused by defects in material used to form an optical conduit or device such as lenses or optical fibres. Light sources and light detection circuitry may be exposed to electrical noise or interference from magnetic fields from nearby inductors or systems, or alternatively to noise caused by fluctuations in the power supply. Also environmental conditions such as temperature have an effect on material properties such as Verdet constant and also an effect on the noise generated in the light source and in the light detection circuitry. Furthermore, all electrical components and light sources and light detection elements suffer degradation over time. All the factors mentioned above contribute to a reduced precision of the measurements performed by the system.

SUMMARY OF THE INVENTION

A calibration prior to commencing measurements and monitoring of a transformer station by using a Faraday optical current sensor is contemplated to give a more precise determination of the current in the electrical conductor. Furthermore, a precise measurement depends on having a stable light source outputting a constant amount of light, alternatively determination of the change of the intensity of the light from the light source as well as light intensity changes caused by temperature variations.

A system for monitoring a transformer station may be fitted with a data collection and data transmission unit for transmitting the collected data to one or more computers monitoring a number of transformer stations. These communication units may be constituted by wireless connections or fixed connections such as POTS/PSTN networks. The communication from the measurement system mounted in the individual transformer stations to a central computer may include information on average loads, current peaks, actual current for the high voltage current lines, energy direction, maximum currents, actual voltages, ambient temperature and time stamps for all the above-mentioned information. Furthermore, the measurement system may include an alert function for alerting an operator in a power supply company about situations where the peak current is above a given maximum threshold, alternatively below a minimum threshold, a situation where the voltage is above maximum threshold, alternatively below a minimum threshold or other information such as ambient temperatures being out of range, all of which indicate some failure or fault in the transformer station.

The communication unit further provides the opportunity of performing a remote configuration of the system, giving an operator the possibility to configure the system, e.g. defining levels for peak currents, voltage drop out levels, time out values and alerting options.

The system outlined above may also be employed in industries such as windmills or in power plants such as coal driven or nuclear plants and is not limited to applications in transformer stations.

The present invention also relates to a method of measuring high voltage current in electrical conductors, said method comprising:

provinging a light source, said light source being an LED based light source, alternatively an incandescent light source, providing a first optical conduit being a first optical fibre, said first optical conduit conducting light emitted from said light source, providing an optical electric current measurement device comprising:

a housing defining a first open end and a second open end opposite said first open end, a first sealing means having an aperture, said first sealing means having an overall geometrical configuration corresponding to the overall geometrical configuration of said first open end of said housing, said first sealing means further comprising an aperture adapted for receiving said first optical fibre, a first fixture means for fixating said first optical fibre, a first optical lens having a reception part adapted for receiving said first fixture means for mounting said first optical fibre in optical continuation with said first optical lens, said first optical lens mounted in said housing, a first polarisation filter mounted in said housing in optical continuation with said first optical lens, a glass rod received in and encapsulated within said housing in optical continuation with said first polarisation filter, said glass rod being constructed from a material having magneto-optical properties, a second polarisation filter mounted in said housing in optical continuation with said glass rod, a second optical lens mounted in said housing in optical continuation with said second polarisation filter, said second optical lens adapted for receiving a second fixture means, a second fixture means for fixating a second optical fibre, said second fixture means received in said second optical lens, a second sealing means for sealing said second end of said housing, said second sealing means having an aperture for receiving a second optical fibre, said second sealing means mounted in said second end of said housing end, and a first and second lid adapted for fixation to said first and second end, respectively, of said housing, said first and second lid including an aperture for receiving said first and second optical fibre respectively, said optical electric current measurement device receiving said light from said first optical conduit, a second optical conduit being said second optical fibre, said second optical conduit receiving said light emitted from said optical electric current measurement device, providing a detection means for detecting said light emitted from said second optical conduit and converting said received light to an electrical signal, providing a processing means for processing said electrical signal from said detection means, providing a current measurement system for performing calibration measurements for said system, and providing a first communications means.

The calibration may be performed to eliminate signal degradations, e.g. caused by worn or damaged components, and may also compensate for interference from other sources emitting electrical fields, such as other electrical cables.

When the sensor is placed on a specific electrical cable of a plurality of electrical conductive cables, the system may perform a calibration so as to eliminate the influence from the remaining part of the plurality of electrical conductive cables.

The calibration is performed when the system is first installed, and is consequently able to compensate for device or component degradation.

The present invention further relates to a method of calibrating a system for measuring high voltage current in electrical conductors, the method comprising:

providing an electrical conductor carrying high voltage current, providing a light source, providing a first optical conduit defining a first and a second opposite end, said light source connected to said first end of said first optical conduit, said light source emitting light into said first optical conduit, providing a Faraday current measurement device defining a first and a second opposite end, said first end of said Faraday current measurement device connected to said second end of said first optical conduit, said Faraday current measurement device receiving said light from said first optical conduit, providing a second optical conduit, defining a first and a second opposite end, said first end connected to said second end of said Faraday current measurement device, providing an optical detection means for converting said light to an electrical signal, said optical detection means connected to said second end of said second optical conduit, providing a current measurement system performing a measurement of the current in said electrical conductor, performing said measurement of said electrical current in said electrical conductor, said system for measuring high voltage current in electrical conductors calculating a calibration constant, removing said current measurement system.

Preferably, the method of calibrating a system, further comprises:

said system for measuring high voltage current in electrical conductors periodically, alternatively aperiodically, recalculating said calibration constant by measuring the AC and DC components of said electrical signal.

According to a particular aspect of the present invention, the method further comprises the steps of initially determining the DC component of said optical signal, then periodically determining the DC component of said optical signal, determining the actual AC component by Multiplying the measured AC component with the ratio of said initially determined DC component and said periodically determinated DC component.

The method according to the present invention is preferably implemented using the Faraday current measurement device also according to the present invention.

BRIEF DESCRIPTION OF THE DRAWINGS

The present invention is now to be further described with reference to the drawings in which FIG. 4 is a schematic view of an end of a Faraday optical current sensor, FIG. 5 is a schematic view of an end of a Faraday optical current sensor, FIG. 6 is a schematic block diagram of a system for measuring electric current comprising a Faraday optical current sensor, FIGS. 20 and 21 are schematic illustrations of a sensor housing according to the present invention.

DETAILED DESCRIPTION OF THE INVENTION

Figure 1:
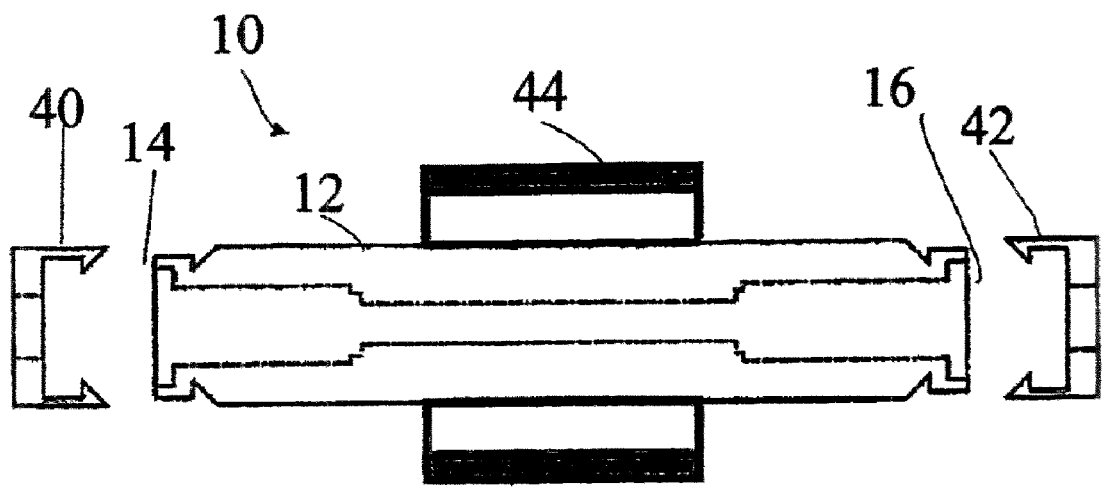
FIG. 1 is a schematic cross-sectional view of a Faraday optical current sensor.
Figure 2:
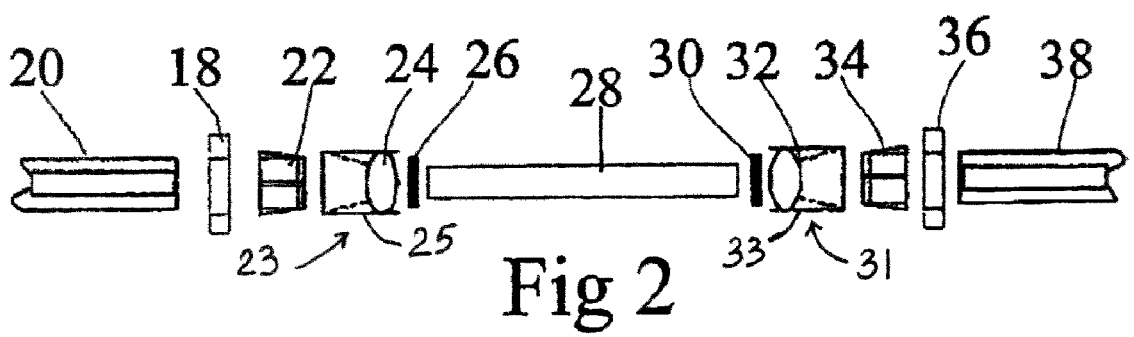
FIG. 2 is a zoomed schematic cross-sectional view of a Faraday optical current sensor, FIG. 3 illustrated a groove in the housing of a Faraday optical current sensor.

FIG. 1 is a schematic cross sectional view of a Faraday optical current sensor 10. and FIG. 2 is a zoomed schematic cross sectional view of the Faraday optical current sensor 10 of FIG. 1. The Faraday optical current sensor 10 comprises an oblong housing 12 defining a first and an opposite second end; designated 14 and 16 respectively. At the first end 14 of the housing 12 a first sealing element 18 is mounted, the first sealing 18 having an aperture for receiving a first optical fibre 20. A first fibre fixture 22 is mounted in the housing 12. The first fibre fixture 22 has an aperture for receiving the first optical fibre 20. A first lens holder 23 holds a first optical lens 24 and has a receiving section 25 for receiving the first optical fibre 20 and the first fibre fixture 22. A first polarization filter 26 is mounted in optical continuation with the first optical lens 24. A glass rod 28 (which may be made of FR6) is mounted in optical continuation with the first polarization filter 26. At the opposite end of the glass rod 28 a second polarization filter 30 is mounted in optical continuation therewith. A second lens holder 31 holds a second optical lens 32 in optical continuation with the second polarization filter 30. The second optical lens holder 31 includes a receiving section 33 for receiving a second fibre fixture 34. A second sealing element 36 having an aperture for receiving a second optical fibre 38 is mounted at the second end of the housing 12.

Two optical fibres 20, 38 are inserted through the first and second sealings 18, 36 into the first and second fibre fixtures 22, 34, respectively. The optical fibres 20, 38 are mechanically fixed to the housing 12 by means of two sensor lids 40, 42, respectively. The sensor lids 40, 42 fix the fibres 20, 38 and seal the Faraday optical current sensor 10.

The material used to mould the sensor lids 56,58 is preferably a plastic material able to withstand temperature ranges from −40 to 150° C. and have an electrical isolating property. The material is preferably non-permeable to light in the 400 to 1000 nm range. Materials with the above mentioned properties may be a plastic materials such as Ultem or Peek.

The housing 12 may further comprise a set of wings 44 for the mounting of the Faraday optical current sensor 10 to an electrical conductor by plastic strips or other fastening means.

Figure 3:
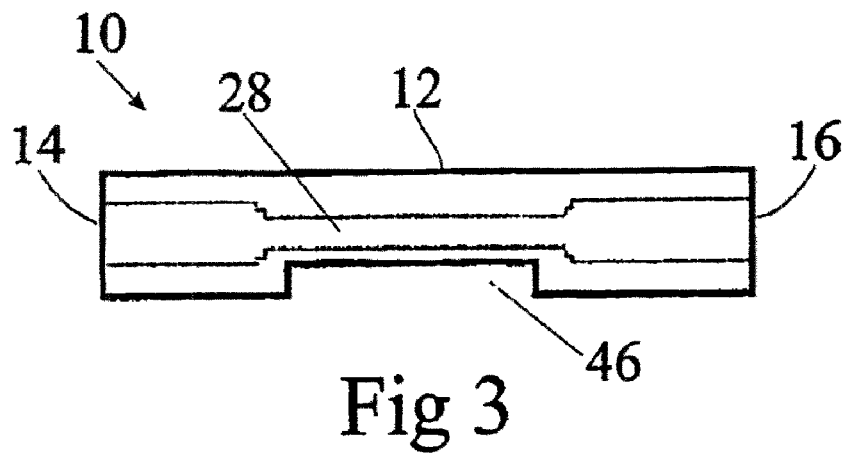

FIG. 3 is a schematic side view of a faraday optical current sensor 10 illustrating a groove 46 in the housing 12 extending parallel with the glass rod 28. The groove 46 may have a planar bottom wall or alternatively a rounded bottom wall for improving the fixation of the Faraday optical current sensor 10 to an electrical conductor. The groove 46 is incorporated in the housing in order to bring the glass rod 28 as close to the electrical conductor as possible and have the further advantage of fixating the Faraday optical current sensor 10 at a 90-degree angle with respect to the electrical conductor. The width of the groove 46 may be arbitrary but preferably have the same or shorter length than the length of the glass rod 28. The fixation wings 44 may be incorporated in a geometrical expansion of the groove 46.

FIG. 4 is a schematic view of one end 14 of the Faraday optical current sensor 10. The Figure illustrates the first polarisation filter 26 mounted in the housing 12.

FIG. 5 is a schematic view of the opposite end of the Faraday optical current sensor 10 illustrated in FIG. 4. The Figure further illustrates the second polarisation filter 30 mounted in the housing 12 rotated 45° with respect to the first polarisation filter 26. The geometrical configuration of the polarisation filters are illustrated as square, alternatively, the filters may have any geometrical configuration as long as the polarisation planes of the two polarisation filters are rotated 45°, respectively.

A prototype version of the Faraday optical current sensor 10 having the following mechanical dimensions has been constructed. The overall length of the housing 12 is 65 mm and the diameter 12.6 mm. The opening for receiving the fibre is 7.5 mm. The wings 44 have an overall size of 11.6 mm×40 mm from end to end. The groove has a length of 45 mm. The glass rod has a length of 35 mm and a diameter of 4 mm. The polarisation filters are square, with each of the sides being 5.3 mm.

FIG. 6 is a schematic view of a system for measuring electric current in a conductor by utilizing the Faraday effect in a magneto-optical transducer. The system comprises a light source 46. The light source may be a light bulb or an LED based light source. The light emitted from the light source 46 is guided through a first optical conductor 48, such as an optical fibre. The first optical conductor 48 is connected to a Faraday optical current sensor 10 comprising two polarization filters 26, 30 and a magneto-optical material. The polarization filters 26, 30 are rotated 45° respectively. The Faraday optical current sensor 10 is mounted on an electrical conductor 50 wherein a high voltage current flows, such as 10 kV. The output end of the Faraday optical current sensor 10 is connected to a second optical conductor 52, such as an optical fibre. The second optical conductor 52 is connected to a detection system 54, which converts the analogue optical signal to a digital signal. The digital signal from the detection system 54 is provided to a signal-processing unit 56, which performs a number of calculations on the data. A measurement device 58 is mounted on the electrical conductor 50 for calibration purposes. The measurement device 58 is connected to a current measurement system 60 providing additional data to the signal-processing unit 56.

The signal-processing unit 56 compares, stores and performs calculations on the data from the detection system 54 and the data from the current measurement system 60.

Calibration of the system requires the signal processing unit 56 to compare data from the detection system 54 and the current measurement system 60, the signal processing unit then stores these data. At the end of the calibration the stored data from each of the devices are summed up. The summed up data from the current measurement system 60 is divided with the summed up data from the detection system 54. The result of this division is used as a calibration value, the calibration value is stored in the signal processing unit 56. The current measurement system 60 and the measurement device 58 may be dismounted from the set-up.

The set-up illustrated in FIG. 6, having a light source 46, and Faraday optical current sensor 10 and an optical detection system 54, is sensitive to electrical noise in the light source 46, optical noise in the detection unit 54 and interference from magnetic fields from nearby inductors and systems. The mounting and the set-up of the sensor 10 as well as the shape and the diameter of the conductor to be measured have an influence on the measurements performed by the system. The system may be used in a variety of locations around the world where temperature variations may occur often. The temperature may affect the operation of the light source 46 and the detector circuit in the detection system 54. Furthermore, the light source 46 and the detection system 54 as well as other components in the system may suffer to degradation over operation and product lifetime. A precise measurement depends on a stable light source and determining the compensation factors for the implemented system as well as recording changes in light source output, long term variations of the detection system and variation in temperature of the surrounding environment.

Figure 7:
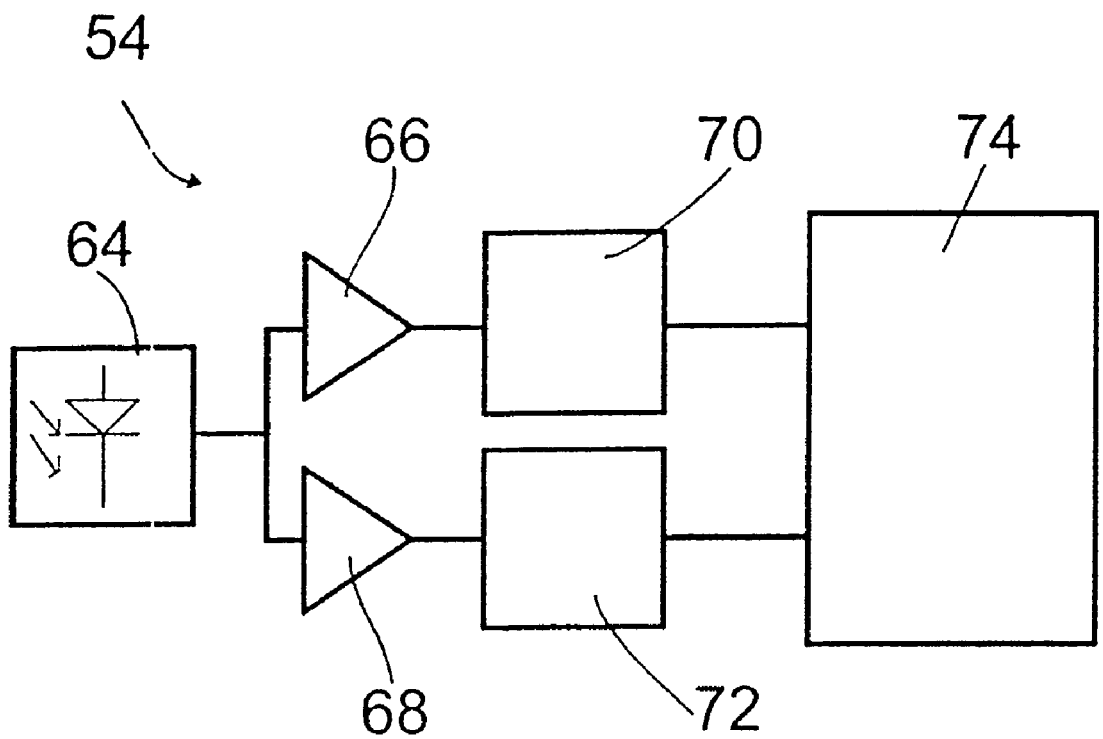
FIG. 7 is a schematic view of the detection system that is a part of the system illustrated in FIG. 6.

FIG. 7 is a schematic view of the detection system 54 of the current measurement system. The detection system comprises a light sensitive component 64 that converts the light received by the detection system 54 from the second light conductor 52. The light sensitive component 64 converts the light to an electrical signal. The electrical signal comprises an AC and a DC component, the signal is divided in two and provided to two amplifiers 66, 68, and the amplified signal from the amplifier 66 is supplied to a DC separator 70 separating the DC component from the amplified signal. The amplified signal from the amplifier 68 is supplied to an AC separator 72 separating the AC component from the amplified signal. The analogue signal processing unit 74 converts the DC separated signal and the AC separated signal from analogue signals to digital signals. The DC signal is compared to a stored DC signal value measured during calibration of the system. The percentage change from the calibrated DC component is multiplied to the AC component. The signal from an optic Faraday effect sensor comprises a DC and an AC component. The AC component arises when a time-varying magnetic field is applied to Faraday optical current sensor 10. The DC component arises if a DC or a non-magnetic field is applied to the Faraday optical current sensor 10, if the AC signal includes a DC component, long-term variations of the detection system and variations in temperature of the surroundings.

Figure 8:
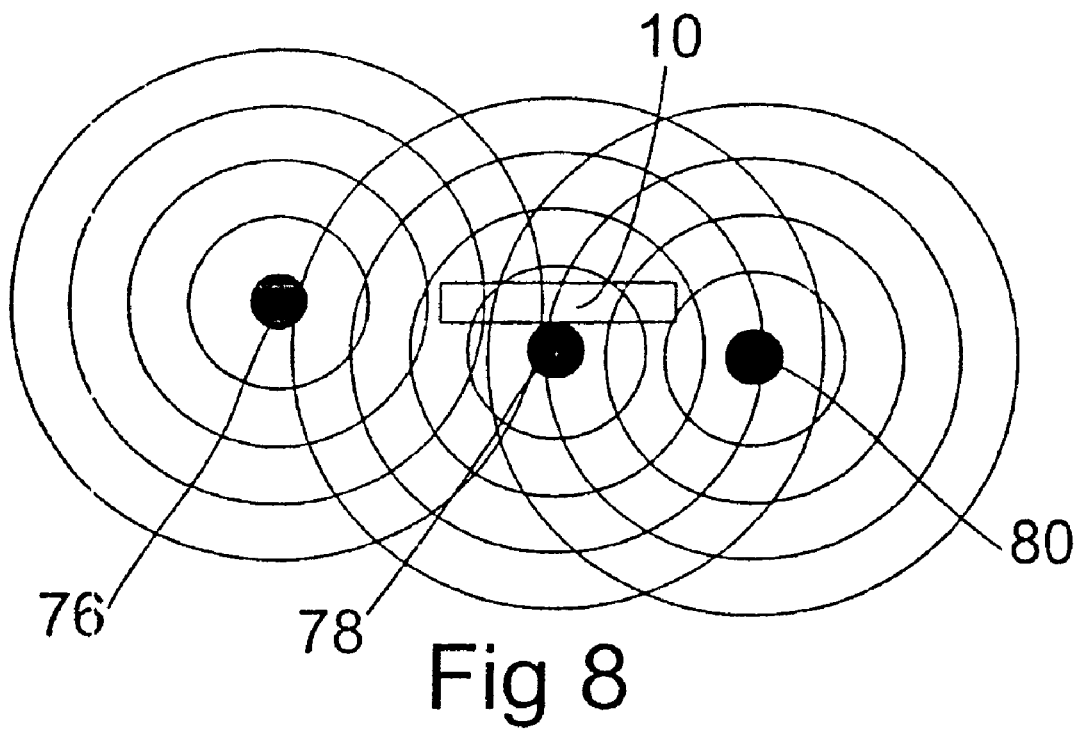
FIG. 8 is a schematic cross-sectional view of a measurement set-up with three electrical conductors and one Faraday optical current sensor

FIG. 8 is a schematic, cross sectional view of a set-up with three electrical conductors 76, 78, 80, each being a high voltage conductor. The concentric circles around each of the conductors represent the electromagnetic field radiated therefrom, illustrating that measurements on electromagnetic fields emitted from one conductor 78 by a sensor 10 may be influenced by fields radiated from other electrical conductors 76, 80. The calibration process is performed in order to eliminate the interference from neighbouring conductors and other electromagnetic fields in the surroundings influencing the sensor 10. These other magnetic fields may originate from electrical equipment within a transformer station in which the sensor is mounted, or fields radiated from the electrical conductor on which the sensor is mounted being reflected from the interior of the transformer station, alternatively reflected electromagnetic fields emitted from neighbouring electrical conductors.

Figure 9:
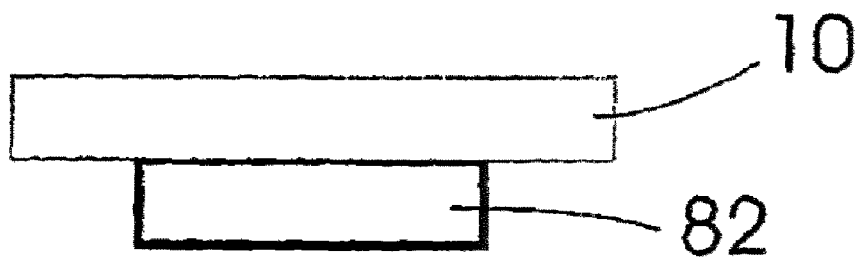
FIG. 9 illustrates a measurement set-up with a rectangular conductor.

FIG. 9 illustrates a set-up with a Faraday optical current sensor 10 mounted on a rectangular conductor 82.

Figure 10:
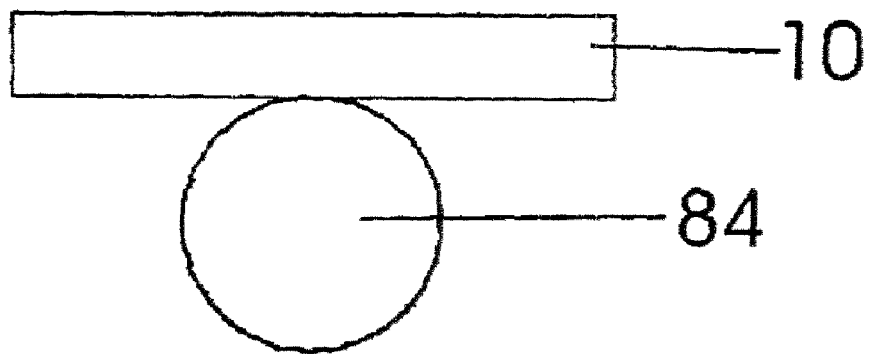
FIG. 10 illustrates a measurement set-up with a circular conductor.

FIG. 10 illustrates a Faraday optical current sensor 10 mounted directly to a circular conductor 84.

Figure 11:
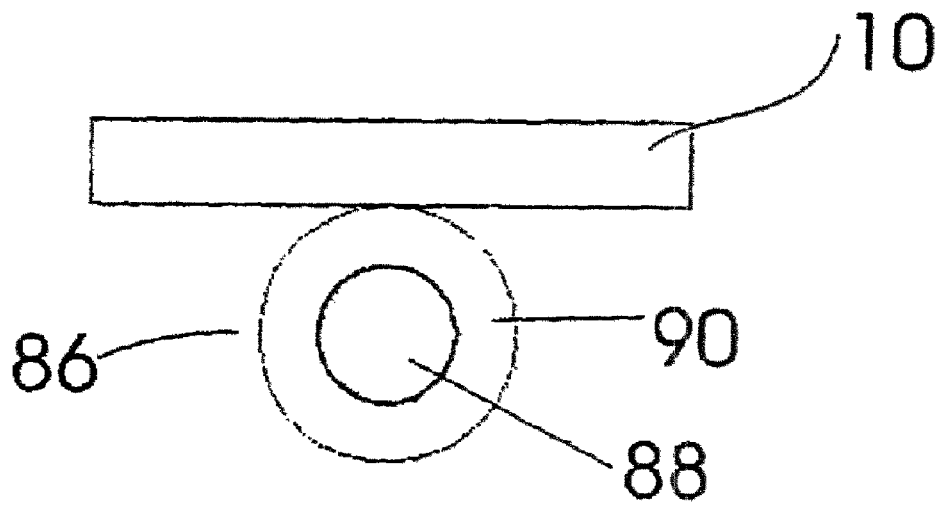
FIG. 11 illustrates a measurement set-up with a circular conductor with an insulating layer.

FIG. 11 is a schematic cross sectional view of a Faraday optical current sensor 10 mounted on a circular conductor 86 having a conductive core 88 and an insulator layer 90 arranged surrounding the perimeter of the electrically conductive core 88. The Faraday optical current sensor 10 is a point measurement sensor, and the shape of the B-field and the distance between the inductor are parameters to be considered. The on-site calibration of the sensor system compensates for the B-field shaped variations and the distance from the inductor, as well as static electromagnetic fields present, originating from other sources.

The amplitude of the DC component where no magnetic field is applied to the Faraday optical current sensor 10 depends on the intensity of the light emitted from the light source, the resistance through the optic system and the detector circuit. The AC and DC components of the signal have a linear correlation where no DC magnetic field is applied to the optic Faraday effect current sensor.

Figure 12:
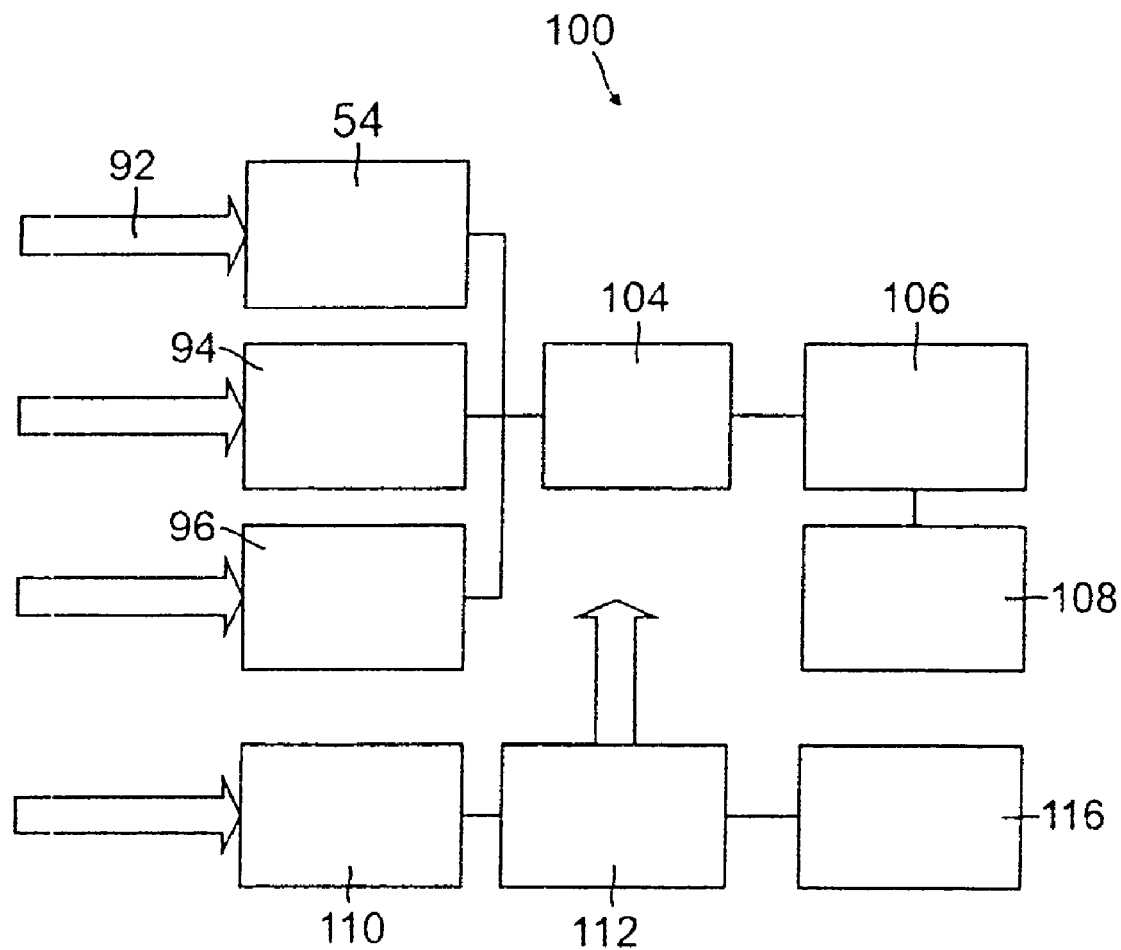
FIG. 12 is a schematic block diagram of a prototype implementation of the detection system and processing unit of the system illustrated in FIG. 6, FIGS. 13 to 18 are schematically views of a prototype version of the present invention, FIG. 19 schematically illustrates the components of the sensor.

FIG. 12 is a schematic block diagram of a prototype implementation of the detection system 54 and signal-processing unit 56 of FIG. 6. The module 100 includes the sensor inputs 92 inputting the signal from the Faraday optic current sensor 10 to the detection system 54 illustrated in detail in FIG. 7. A number of optocouplers corresponding to the number of low voltage drop lines are used to determine the voltage on the voltage drop lines, these voltages being in the range of 400 volts AC. The module further includes a user interface input-output port 96 in the prototype implementation, the input-output 96 in the prototype version is an RS-232 serial communications port. The input-output port 96 is connected to a user interface module 106, used in the set-up and initial calibration of the system.

The data from the detection system 54 and the 400 AC module 94 are sent to a signal and data processing unit 104, which performs a face matching for determining the face angle between the current and the voltage. In a prototype implementation of the measurement system, the signal and data processing unit have been implemented as an embedded dual processor application. The system functionality is split into a measurement part and a communication part. The measurement part handles the scanning of 6 current channels, the scanning of 3 voltage channels and the calculations on the collected data.

The module further comprises a communication module 106 for communicating the data collected by the data processing unit of the processor unit 104. As the system may be installed in a remote location and used for automatic surveillance of the operation of a transformer station, the system may be connected to a central data collection site collecting data from a number of transformer stations for the safe operation of an electrical distribution network. The communication module 106 may be constituted by a module adapted for convening the data from the data processing unit 104 to a communication protocols such as GSM and/or ISDN, alternatively a data communication protocol, such as TCP/IP. The module further includes a transmitter unit 108, which, in case of the communications module being a GSM module is an antenna, alternatively a local area network port or the like. The module 100 further includes a power supply 110 supplying the module with electrical power. The power is supplied to a power management unit 112 dividing the power as system power and for charging a battery module 116 for the safe operation of the module 100 is case of power failure.

In the prototype implementation of the module 100, the protocol for communication the status of the transformer station is described in detail below in a number of tables.

FIGS. 13 to 18 are schematic block diagrams of a prototype version according to the present invention. All components are described by name and product number in the illustrations, and are considered to be self-explanatory when taking in to account the descriptions above.

Figure 13:
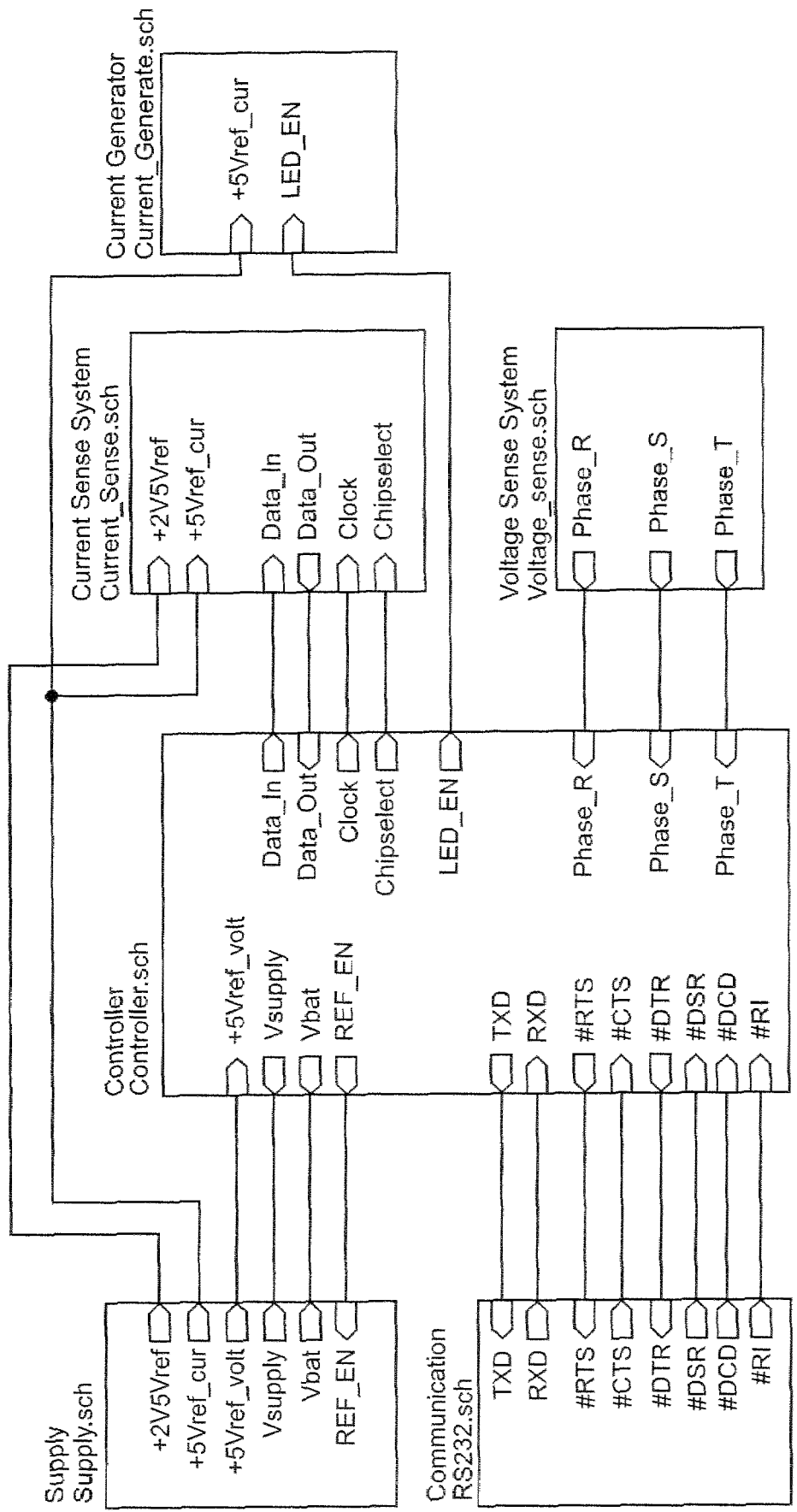

FIG. 13 is a schematic block diagram of a prototype version of a 10 kVSS according to the present invention.

Figure 14A:
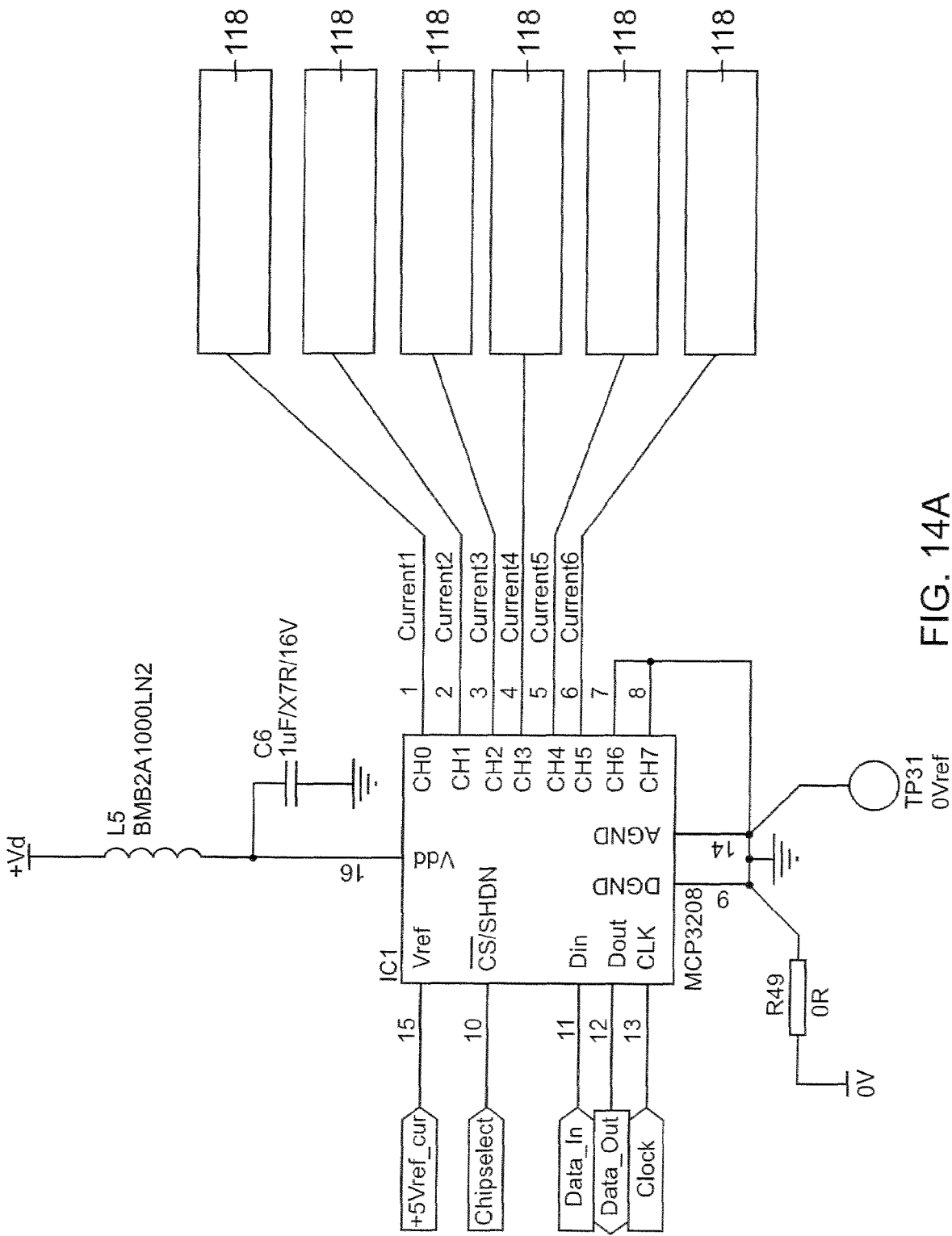
Figure 14B:
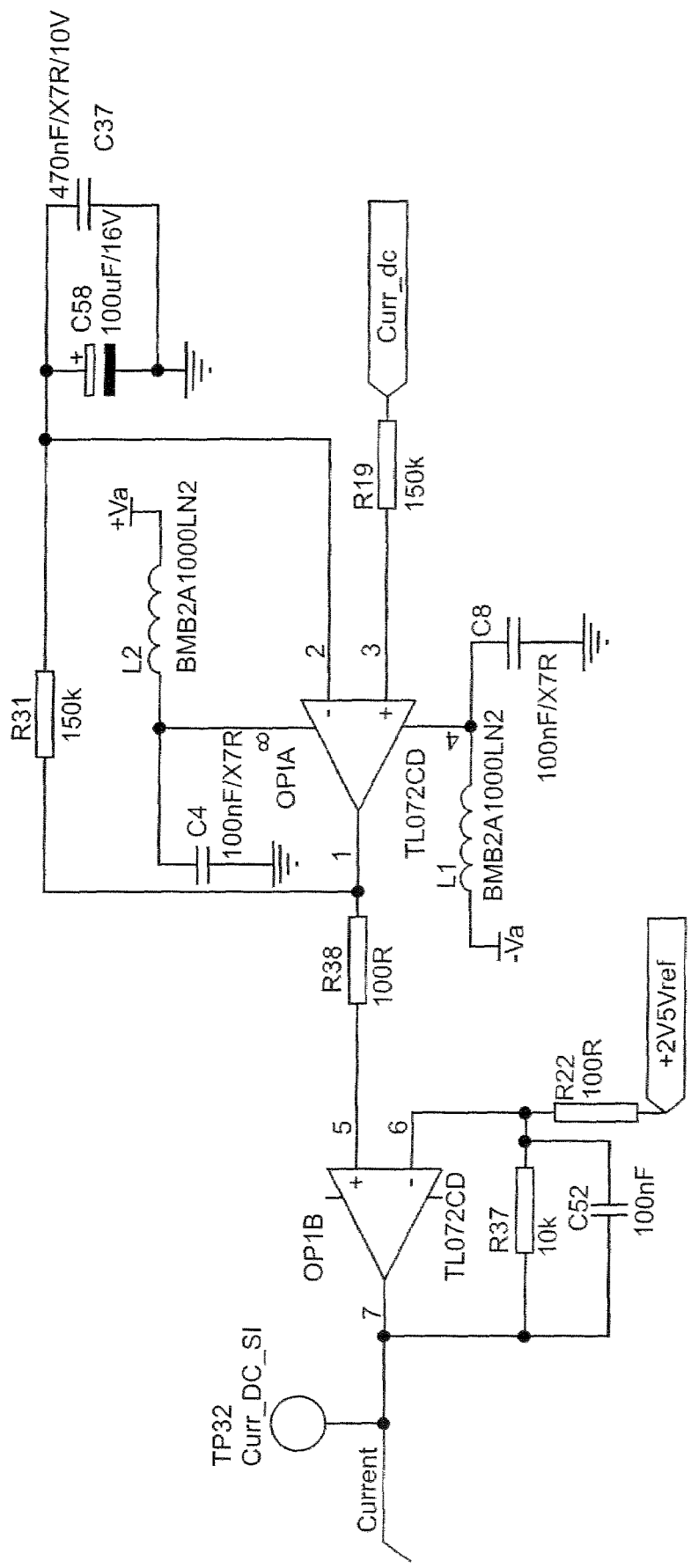

FIG. 14A is a schematic block diagram of a DC current sensor. In the prototype version the DC sensor has 6 channels 118, each channel being supplied with a signal from a sensor circuit illustrated in detail in FIG. 14B.

Figure 15A:
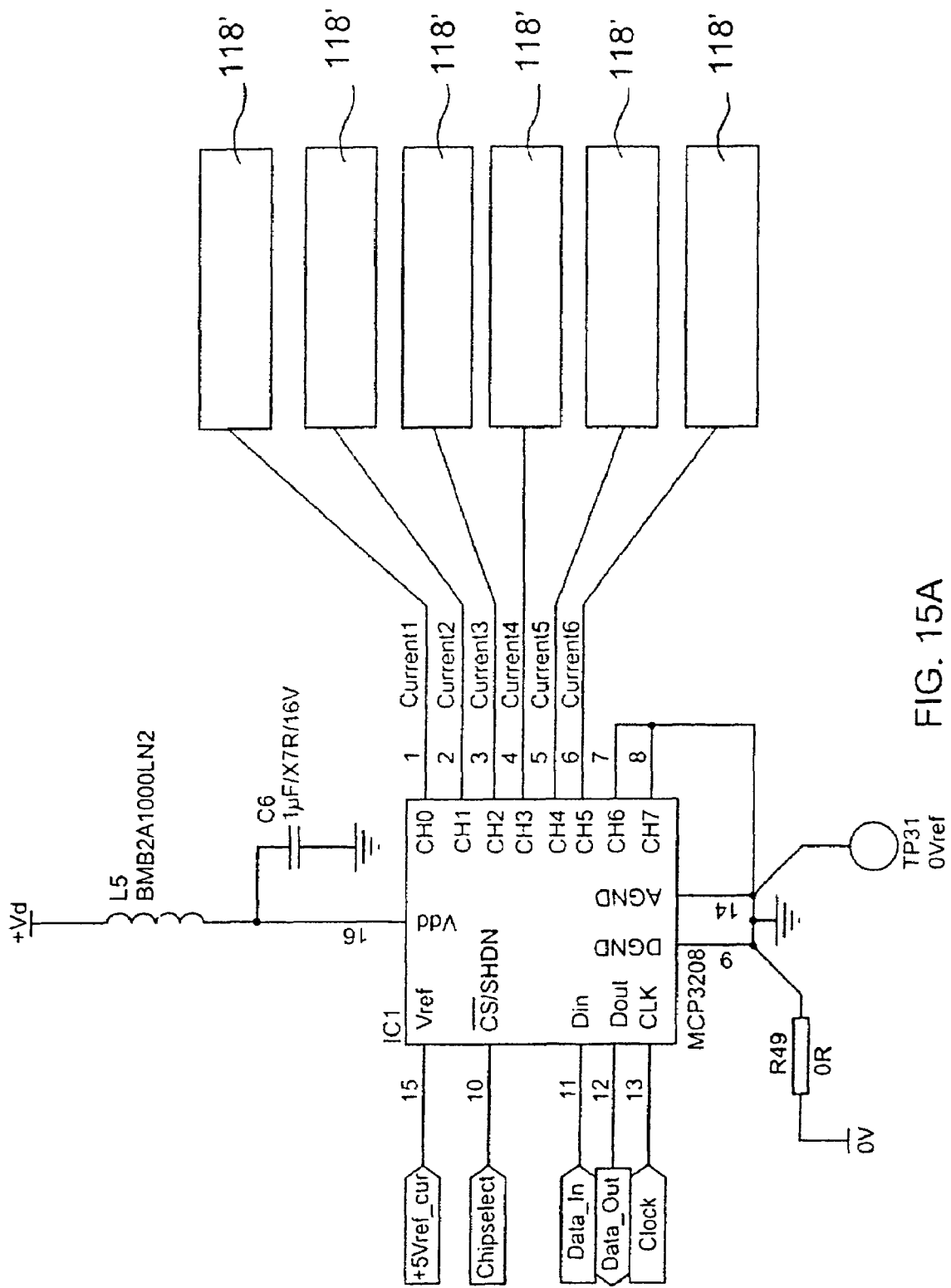
Figure 15B:
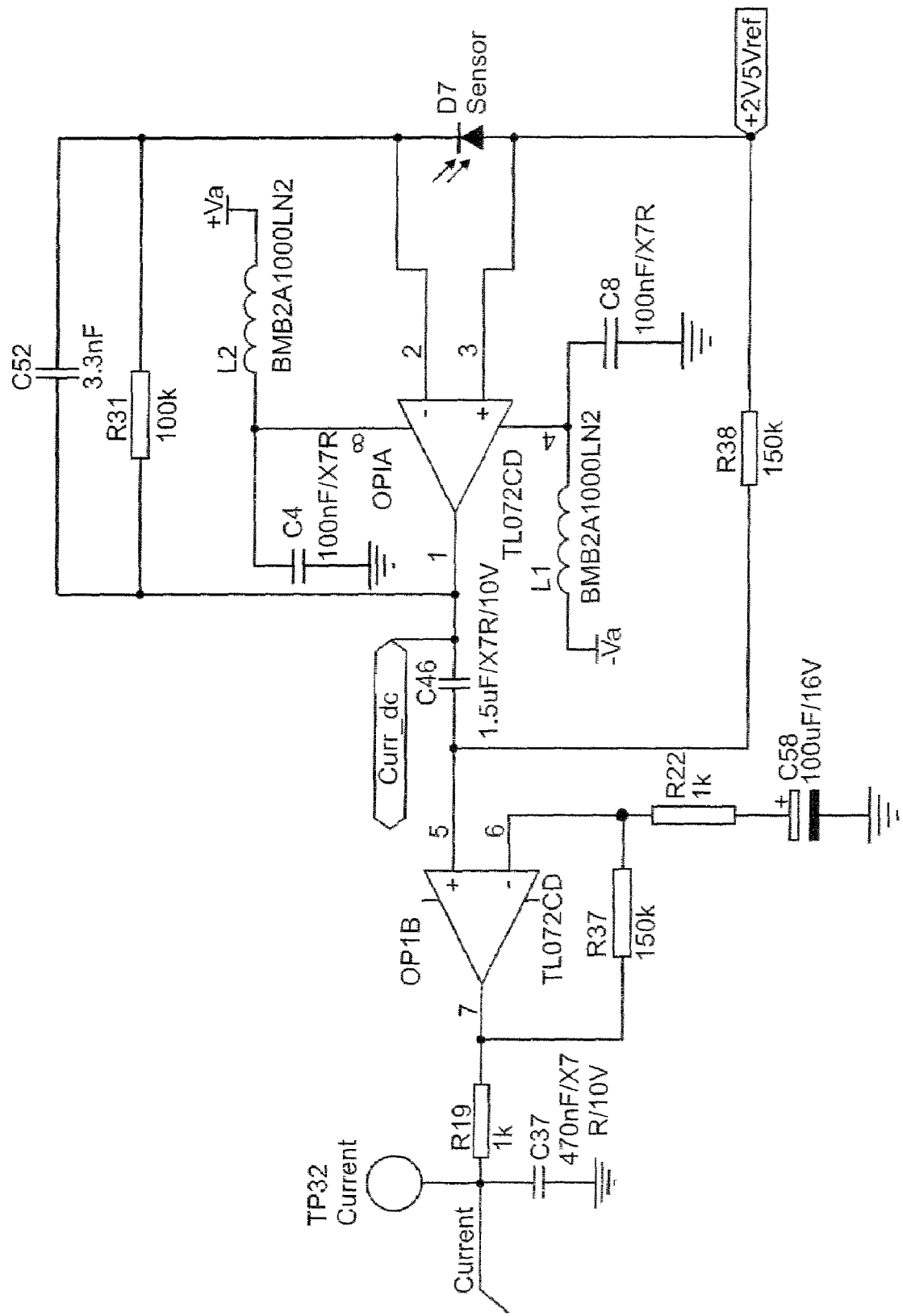

FIG. 15A is a schematic block diagram of a current sensor. In the prototype version the sensor has 6 channels 118', each channel being supplied with a signal from a sensor circuit illustrated in detail in FIG. 15B.

Figure 16:
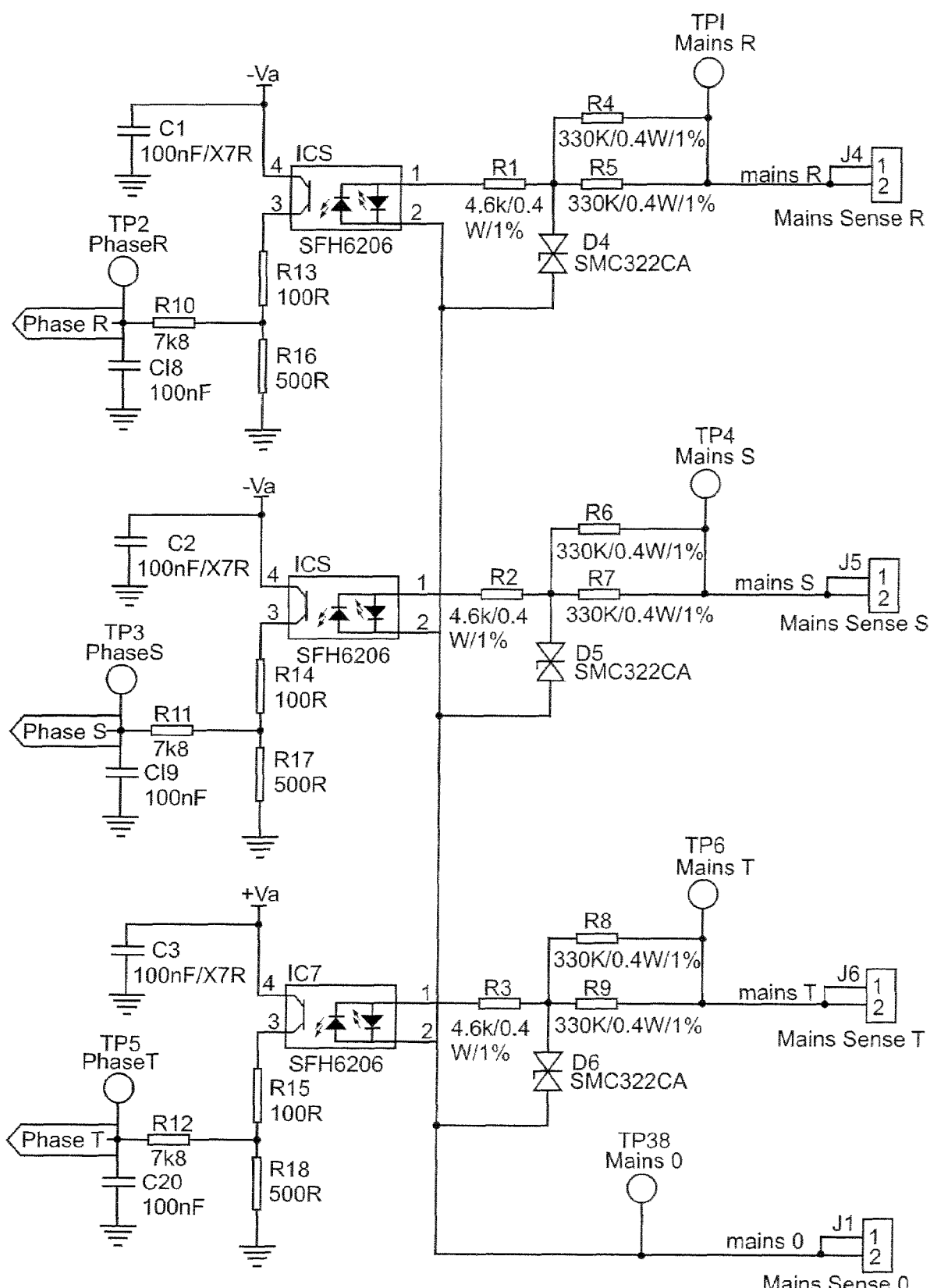

FIG. 16 is a schematic block diagram of a voltage sensor circuit.

Figure 17A:
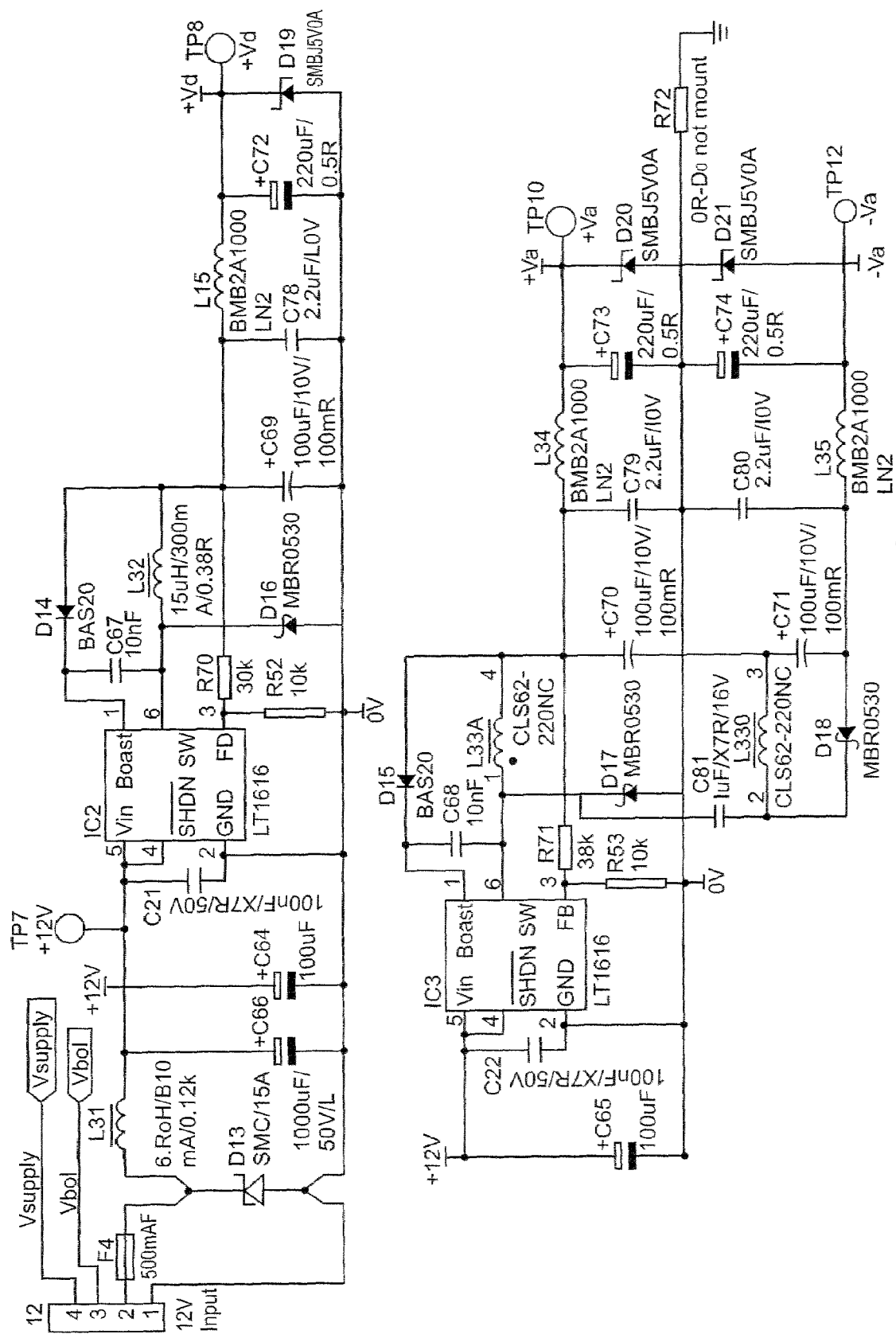

FIG. 17A is a schematic block diagram illustrating a power management circuit.

Figure 17B:
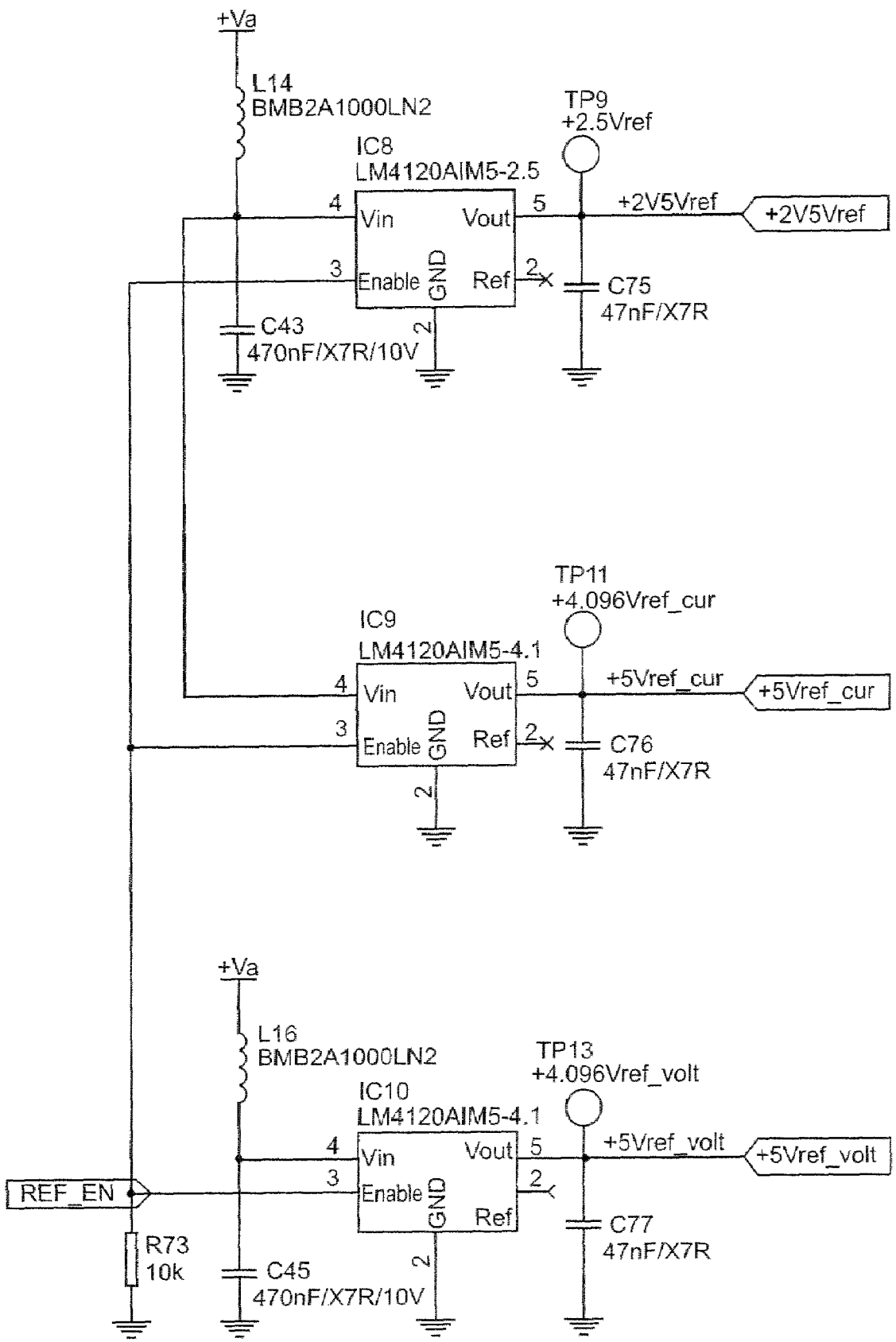

FIG. 17B is a schematic block diagram illustrating a power management circuit co-operating with the power management circuit illustrated in FIG. 17A.

Figure 18:
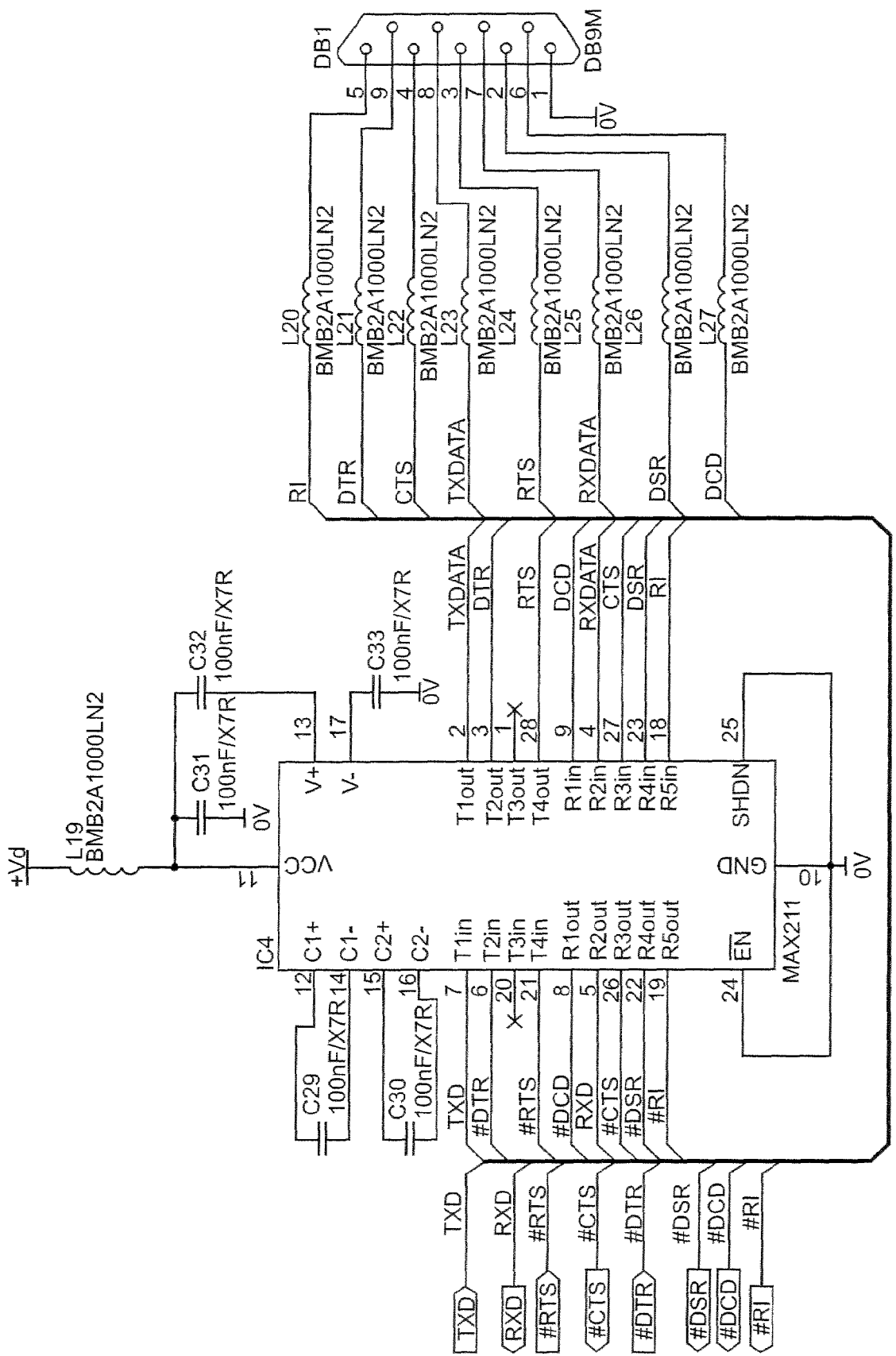
Figure 22:
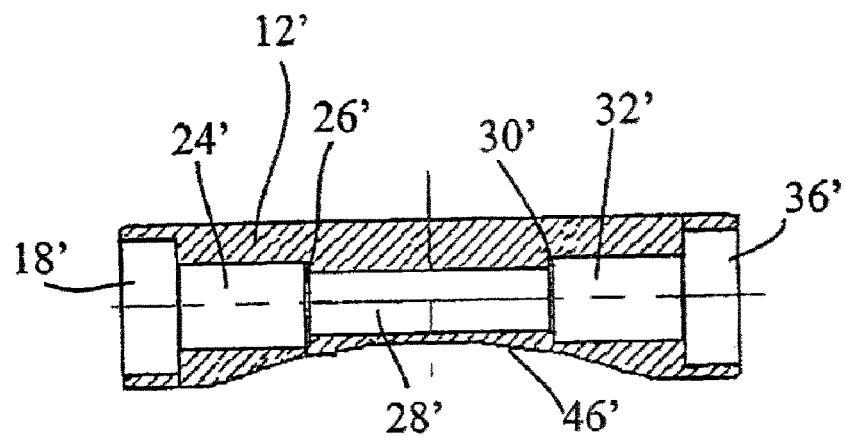
FIG. 22 is a schematic illustration of a cut-through sensor according to the present invention.

FIG. 18 is a schematic block diagram of an RS-232 communications port and the signals relating thereto.

In the following another embodiment of the present invention is discussed. Parts reoccurring in this embodiment and where discussed in relation to the drawings 1 through 18 will have similar reference numerals, FIG. 19 is an illustration similar to that of FIGS. 1, 2 and 3.

FIGS. 20 and 21 illustrate a second embodiment of a sensor 10' according to the present invention. The sensor housing 12' is the main element in the sensor 10'. It handles the mounting on the cable and fixture of the optics. The housing 12' is designed so it can be welded. The plastic is designed to withstand temperatures from −40° C. to 250° C. and has an isolating effect for electricity and heat. The sensor 10' is in the presently preferred embodiment made from PEEK without glass reinforcement. PEEK grades offer chemical and hydrolysis resistance similar to PPS, but may operate at higher temperatures. Un-reinforced compression moulded PEEK offers a high degree of wear resistance.

PEEK may be used continuously up to 480° F. (250° C.) and in hot water or steam without permanent loss in physical properties. PEEK carries a V-O flammability rating and exhibits very low smoke and toxic gas emission when exposed to flames.

The sensor wing 44' is used for mounting the device onto an electrical cable. It is formed so that strips up to 5 mm may be used to fasten the device to a cable. The strips are preferably made of TEFLON® (PTFE) so that they may withstand wide temperature ranges and tough environmental influences. The sensor wing 44' is integrated in the sensor housing 12' and is designed for moulding.

On the surface of the sensor 10' facing the cable, the sensor 10' has an area 46' where the diameter is smaller compared to the rest of the sensor 10'. This area 46' enables a location of the faraday rotator close to the cable and fixes the sensor 10' at 90° degrees relative to the cable.

A short distance between the conductor and sensor 10' is important because the intensity of the magnetic field decreases as the distance from the cable increases.

The faraday light rotator 28' is mounted in the housing 12'. The tolerance is kept tight; therefore the glass rod 28' is mounted with a light press fit.

The Polaroid filters 26' and 30' are mounted in the housing 12' in optical continuation with the glass rod 28'. The filters 26' and 30' are turned 45° degrees with respect to each other. This is done to obtain the largest signal bandwidth.

It has been tried to glue the filters 26' and 30' onto the glass rod 28'; this should gain 4-5% more light through the optical matrix. But due to different temperature gradients in glass, glue and filters, the filters fell off in stress tests. It was also less cost efficient in production. In the presently preferred embodiment, a small lowering has been designed in the sensor housing 12' to fix the Polaroid filters 26' and 30'. The filters 26' and 30' may move according to temperature changes and may still have a reasonable optical construction. The filters 26' and 30' are fixed in the square and the lens.

The Polaroid filter is used for viewing the angle turn of the light. The Polaroid filter is made of plastics and is only 0.2 mm thick. The Polaroid filter is of such a material that it holds its strength within a temperature range of −40° C. to 80° C. The filter is linear polarized and made by a punching tool in production. The filter may be steamed directly onto the glass rod.

The lenses 24' and 32' are mounted in the housing 12' in optical continuation with the filters 26' and 30', respectively. The lenses 24' and 32' hold the Polaroid filters 26' and 30' in the squares. The lenses 24', 32' are mounted with a small press fit, and are therefore fixed in the optical matrix.

Figure 26:
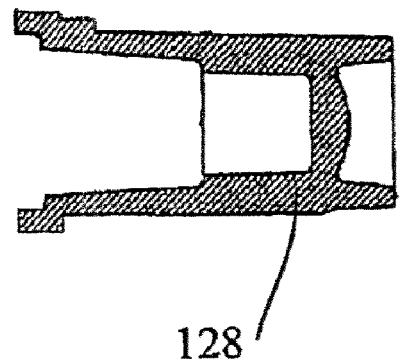
FIG. 26 is a schematic cut-through view of a FIG. 27 is a schematic view of a wire clip.

The optic fibre is placed into the fibre fixture 128, illustrated in FIG. 26. When the fibre fixture is clicked into the optical lens system, the fibre end is positioned in the focal point. When fibre fixture is placed in the optical lens, it tightens around the fibre and takes care of mechanical stress.

Silicon sealings 18' and 36' are placed at opposite ends of the housing 12'. The sealing plugs 18' and 36' are used for sealing the sensor 10' thereby protecting it against dust, steam, water and other deteriorating influences. The sealing also functions as a tightening of the optic fibres, not illustrated here.

The function of the sealing is to secure the optical part of the sensor 10', primarily against water and dust. When the lid is pressed onto the sensor housing 12' the sealing is pressed against the fibre to handle mechanical stress. The sealing is designed to hold its strength within a temperature range of −40° C. to 120° C. It has a good resistance to chemicals and ozone.

Figure 23:
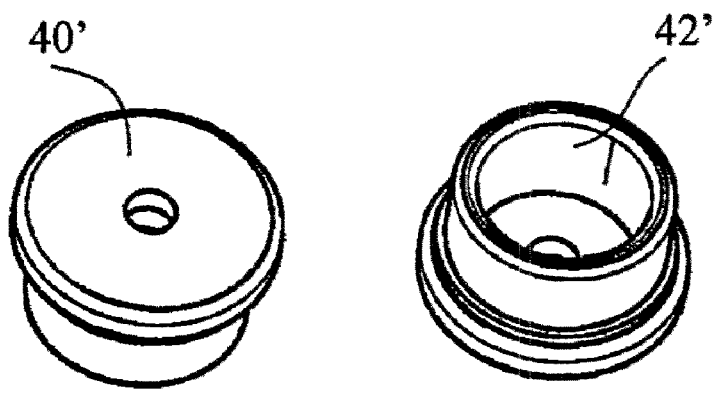
FIG. 23 is a schematic view of two sensor lids.
Figure 24:
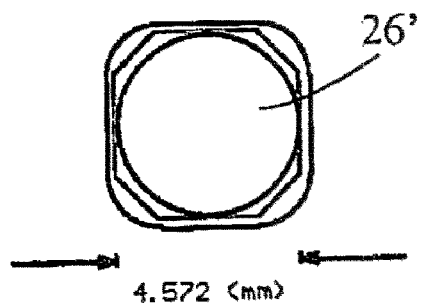
FIG. 24 is a schematic view of an optical filter.

In FIGS. 19 and 23, two sensor lids, 40' and 42' are illustrated. The sensor lids 40', 42' may be fastened to the housing 12'. The sensor lids are easily clicked onto the housing 12'.

Each of the sensor lids is used to fix the fibre and sealing of the sensor 10'. The lids 40', 42' are constructed and designed for plastic welding.

The lids are today made from PEEK without glass reinforcement, which is preferably the same material as the housing 12'. The sensor lids 40', 42' are designed with a cone, which enables a one time fixability to the sensor housing.

The sensor lid has a round and short bottom, so when it is mounted in the sensor housing 12' with the sealing, it squeezes the sealing around the fibre and closes the sensor 10' so that it is protected against dirt and other pollutants.

The optic fibre transports the light from the light emitter to the sensor 10' and from the sensor 10' on to a light detector.

In the presently preferred embodiment of the present invention, the optical fibre is a full duplex fibre with Kevlar reinforcement for strain relief. The optic fibre matches for visible red light in the region 400-700 nm. It has a core diameter of 1 mm and an overall diameter of 2.2 mm. The operating temperature range is from −25 degrees C. to +100 degrees C. continuously and up to 120 degrees briefly. The cutting and polish of the fibre ends are important for the system. The fibre is polished according to a 9 my standard in 3 polishing rounds. This polish grain size is the optimum according to price and light damping. At the sensor housing 12' end of the fibre, the fibre is sealed with silicone so that no humidity may enter the fibre and creeping distance inside the fibre can not occur.

The function of the glass rod is as a light rotator, and it is the "motor" in the sensor 10'. It is constructed of a BK7 material with a low Verdet constant of 0.023 min/G-cm by a wavelength of 620 nm. It is polished at the ends according to S:D: 40:60 and the material is strain relieved in production after moulding. The material has been selected due to a small change of Verdet constant as a function of temperature, low but acceptable Verdet constants for signal and low cost.

Figure 25:
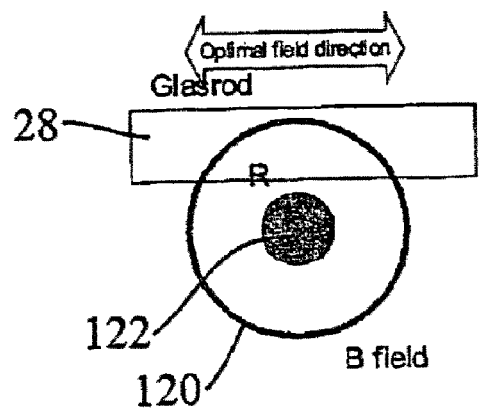
FIG. 25 is a schematic view of a electrical cable, the B-field emitted therefrom and a glass rod.

The width of the glass rod has been selected based on the optimum width of the lens. The angle between the magnetic field and the light beam can be described as a cosine function. If the magnetic field is 90 degrees in front of the light, no rotation effect occurs. The length of the glass rod is linear to the signal output. The B-field 120 on a round conductor 122 is illustrated in FIG. 25.

The rotating effect of the field decreases due to higher angle between the light and magnetic field. The damping of the light in the system is also crucial for a good signal. When the light is bent by the lens it is not perfectly linear to the optimal direction; therefore the longer glass rod, the less light passes through. The length of the glass rod has been decided from tests to be an optimum distance between the magnetic field effect and damping of light.

Figure 27:
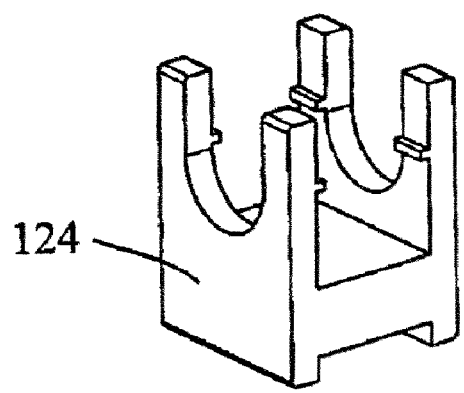

In FIG. 27 a fibre distance clip 124 is illustrated. The function of the fibre distance clip 124 is to fix the fibre at a distance from the cable. The clip 124 is designed to press and hold the fibre, and to fix the fibre to the cable with the TEFLON® strip.

The distance between the fibre and the cable is needed for thermal and electrical isolation reasons. The optical fibre as it is today, is only capable to withstand peak temperatures of approximately 120 degrees. Since the electrical cable may reach temperatures up to 250 degrees, there must be a thermal isolating distance. The fibre is also separated from the cable to avoid a humidity bridge and a possible creeping distance. The fibre distance clip 124 is moulded in Peek, the same material as used for the sensor housing 12'.

Figure 28:
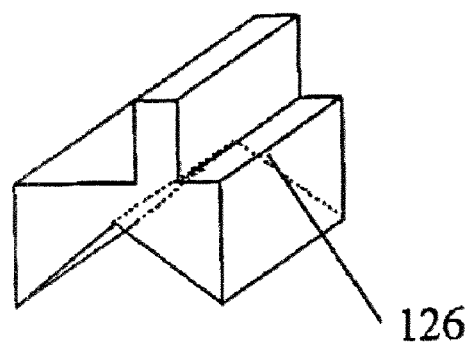
FIG. 28 is a schematic view of a distance piece.

A sensor clip is illustrated in FIG. 28. The clip 126 creates a higher thermal resistance between the cable and sensor 10'. So if the sensor 10' the mounted directly on a wire, the clip 126 is press fitted onto the sensor wing 44'. This clip 126 makes it possible with a cable temperature of 300 degrees, not having above 120 degrees inside the sensor 10'.

Figure 29:
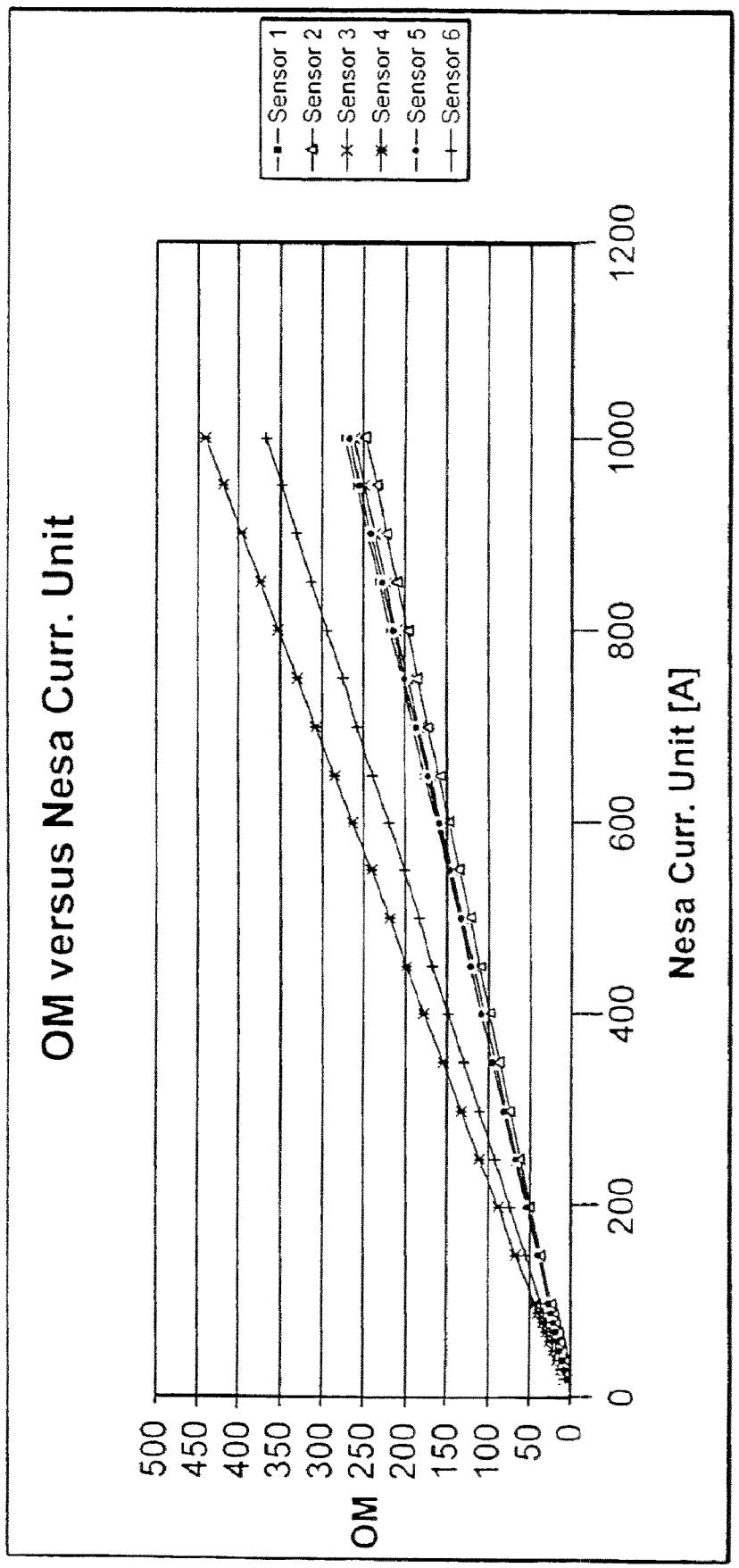
FIG. 29 is a graph illustrating the relation between current and optical magnitude.
Figure 30:
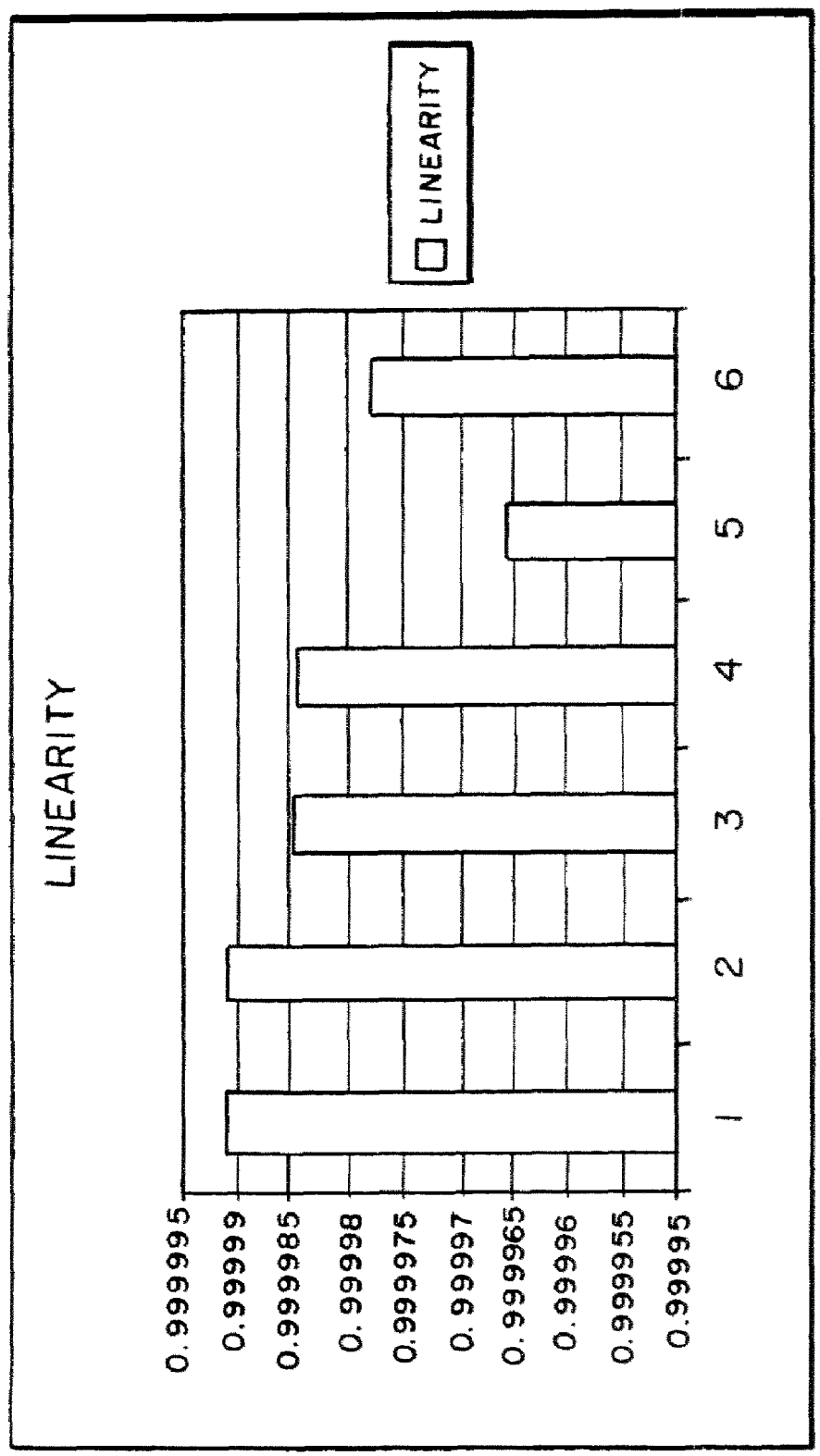
FIG. 30 is a graph illustrating the degree of linearity of six sensors.

FIGS. 29 and 30 illustrate test results obtained during tests involving six sensors according to the present invention. The graphs show that the sensors exhibit linear properties as a function of current in an electrical conductor.

FIG. 30 illustrates the degree of linearity of the six sensors.

Figure 31:
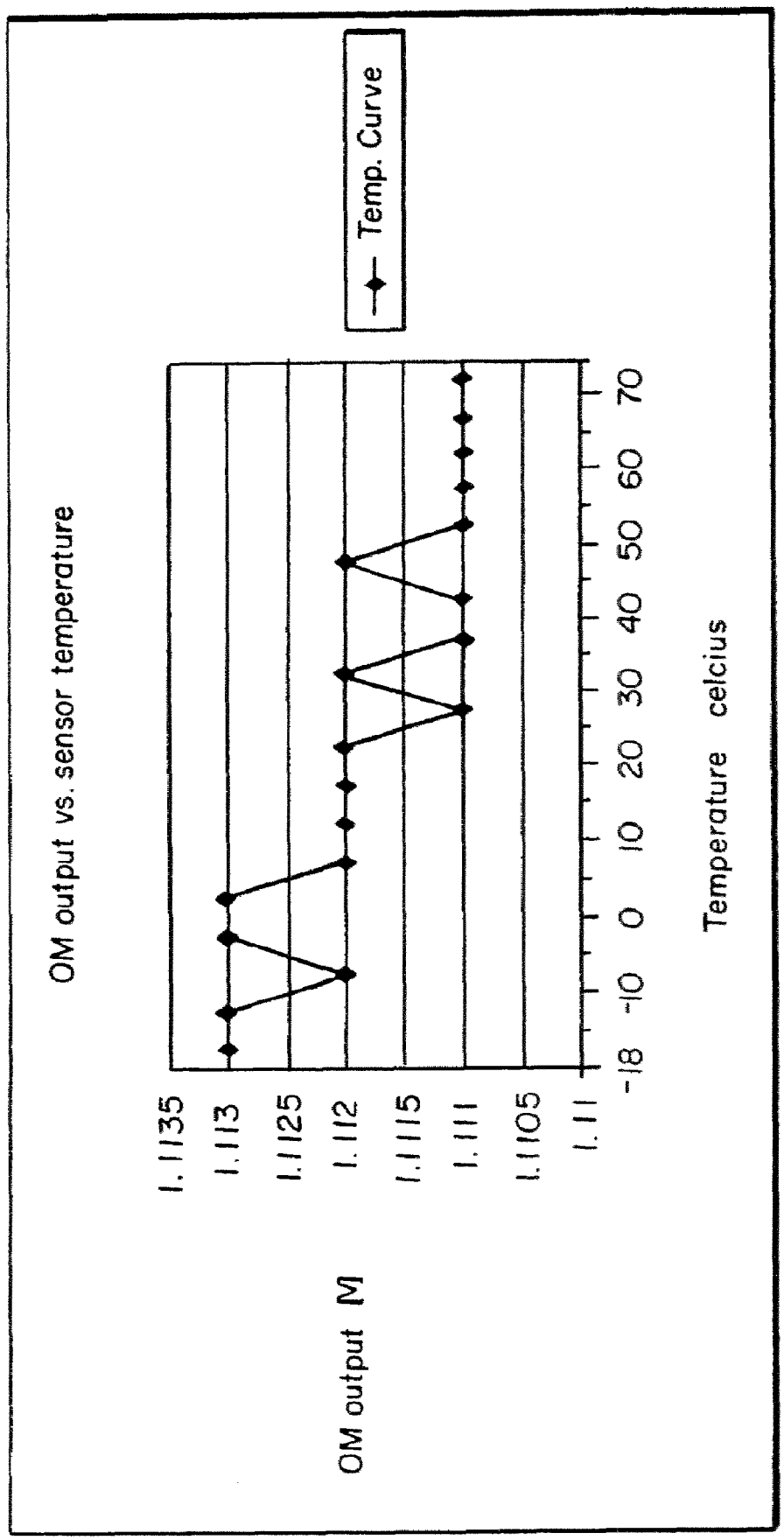
FIG. 31 is a graph illustrating the relation between temperature of a sensor and the optical magnitude.

FIG. 31 is a graph illustrating the output signal of a sensor as a function of the temperature in the surrounding environment and the sensor.

Theoretical background of the invention.

When a simple fibre optic Faraday Effect sensor is mounted on a conductor, for example in a transformer station or on an installation cable, the output optic signal is sensitive to interference from magnetic fields from nearby systems, conductor shape, sensor placement and distance to the conductor. The output optic signal is also sensitive to system mounting and set-up.

The object of this invention is to achieve an accurate device for measuring an electric current by the Faraday Effect, by compensating on-site for interference from magnetic fields from nearby inductors, conductor shape, distance from measuring device to conductor, and also mounting and setup.

This object is achieved by comparing data measured by the fibre optic system with a third party current measurement system during set-up of the system on-site.

The B-field measured by the fibre optic system is named $B_{measured}$. The actual current is determined according to the equation:

$$I_{actual} = K_{Calib} * B_{measured} [A]$$

Were $K_{Calib} = \Sigma_0^n (I_{Measured\ on\ third\ party\ system}) / \Sigma_0^n (B_{Measured\ on\ optic\ system})$ This calibration method compromises for linear magnetic field interference from nearby inductors, and the conversion factor between the B-field and current. It also compromises for production tolerances, conductor shape, conductor diameter and background noise, all when mounted in the active application.

After the calibration, the third party system is removed, and the fibre optic current measurement system is a stand-alone measurement system.

In the addition to use the sensor at all, it is crucial to be calibrated on-site. A third party measurement device is used to measure the electrical current. This device can be a current coil or other current measurement devices that is calibrated, and for which the surrounding field can be ignored. The signal or data from the third party current measurement device is computed in a third party measurement system and send to the signal-processing unit.

The signal-processing unit compares the data from the two devices and store the data. After a certain period, the calibration is stopped and the stored data from each device is summed up. The summed up data from the third party current measurement system is divided with the summed up data from the optic sensor. This value is used as a calibration value and is stored in the signal-processing unit. The third party measurement system and device can be dismounted. The optic system has now an accurate calibration value for the application it is mounted on.

In a set-up with 3 conductors the magnetic field from nearby conductors may affect the measurement. On an inductor a fibre optic Faraday Effect sensor is mounted. The magnetic fields from all 3 conductors affect the sensor. The B-field measured by a sensor x is:

$$B_{sum\_sensor\_x} = B_{L1} + B_{L2} + B_{L3}$$

During calibration $B_{sum\_sensor\_x}$ is compared with the data from the third part measurement device. From this calibration the calibration constant $K_{Calib}$ is determined. This constant contains the contribution from all 3 phases, means that the constant only is valid for a linear B-field.

The B-field is relatively known for a circular conductor, but the B-field is not known for a rectangular conductor. The fibre optic Faraday Effect sensor creates only a point measurement; this means that the shape of the B-field and distance from the conductor is a crucial parameter. The on-site calibrations of the sensor compensates for the different B-field shape and distance from the inductor.

The signal from an optic Faraday Effect current sensor consists of an ac component and a dc component. The ac component exists when the time varying magnetic field is applied to the sensor. The DC component exists if a DC or a non-magnetic field is applied to the sensor.

The object of this invention is to achieve an accurate device for measuring an electric current in AC system, by the Faraday Effect, by electrically measuring the AC and DC component, to compensate via software for degradation of system optics over time. This compensation is bound in the compensation described above.

The size of the DC component, when no magnetic field is applied to the sensor depends on the output of the light exposed from the light source, the "light resistance" through the optic system, and the detector circuit. There is a linear coherence between the ac- and dc-component of the signal, assuming that there is no DC magnetic field applied to the sensor, no long term variations of the detection system and no variation in the temperature of the surrounding environment.

The compensated optical signal, $U_{ac\_actual}$, is determined by:

$$U_{ac\_actual} = (U_{dc\_calib}/U_{dc\_actual}) U_{ac\_measured}$$

Where:

$U_{ac\_actual}$ is the compensated optic ac signal, $U_{dc\_actual}$ is the actual measured dc component, $U_{dc\_calib}$ is the dc signal measured when system was calibrated, $U_{ac\_measured}$ is the actual measured optic ac signal.

The equation above shows how to compensate for changes in the dc component due to optic changes, temperature change, change of performance for the light source, change of performance for the detector, and change of optical resistance in the sensor due to life-time.

The following is a description of a prototype version of the present invention.

In a prototype version of the present invention a system measuring the actual current in and out of the transformer station plus the 400V voltage, reports the measured values via SMS messages over a GSM-modem.

The measured values could be: Actual current (averaged over the last second) for all channels, peak current with direction and timestamp for all channels, 400 V status with timestamp for last dropout, system condition.

Values are sent to a service technician, or alternatively to a server, on request and when alarm limits are exceeded.

More or less complex calculations may be implemented, and sampling rates, number of current channels, etc. may vary. The basic building blocks are the current calculation, the calibration and the correction according to the DC signal.

A prototype version of the present invention includes a processor system with embedded software or firmware. The main task for the firmware of the system may be divided into a number of tasks: Measurement and linearisation of current flow, calculation of current direction, correction according to DC signal and communication with server or service personal.

In the prototype version of the present invention six current channels and three voltage channels are fed into the processor system comprising the firmware through an optocoupler and an AD-converter. The phase between the current and the voltage is used to determine the direction of the current.

Each current channel of the system is principally constructed from an amplifier and filter part followed by an AD-converter. When the signal has passed the AD-converter the firmware performs all the post-processing of the signal.

Each current channel is divided into two signals: The AC current signal and the DC component, both of which are fed through the AD converter. The optical current signal ($U_{AC}$) is used to calculate the actual current. The DC component of the optical current signal is used to calculate the degeneration factor.

The DC Signal ($U_{DC}$) from the optical sensor combined with the DC component is used to calculate the degeneration factor, and from that, the actual calibration constant ($K_{Calib}$).

$$U_{RMS} = \Sigma |U_{AC} - V_{REF}|$$

$$I_{RMS} = K_{Calib} \times U_{RMS}$$

The DC component of the signal is removed and the RMS value is calculated as the integral of the numerical value. The value is multiplied by the calibration constant ($K_{Calib}$) and the result is the current flowing in the actual channel.

The calculation is done for every 50 Hz period. The post-processing of the result is done by the communication part of the system.

Detection, or determination, of the current direction is done through measuring the phase angle between the current and the voltage for the actual channel.

The phase angle depends on the type of load and the direction of the current. The type of load for the actual transformer station is chosen during calibration. If the phase difference, during an inductor load, is between −90° and +90° the current direction is positive.

The current phase is grasped from the optical sensors on the 10 kV line. The voltage phase is captured from the 400V line, due to the fact that the 10 kV voltage is not monitored.

The voltage phase is delayed through the transformation from 10 kV to 400V. Therefore the phase is modified with 30° times the transformer factor.

The firmware in the system compensates for the degeneration of the system by looking on the DC component of the signal. This is done through correction of the initial calibration constant with the degeneration factor.

$$U_{AC,DC} = \Sigma U_{AC} - V_{REF}$$

$$U_{DC,AVR} = (\Sigma U_{DC})/n, \text{ where } U_{DC} \text{ is summed up from 0 to } n \text{ samples.}$$

$$K_{Calib} = (K_{Calib,Init} \times U_{DC,Init})/(U_{DC} - U_{AC,DC})$$

The DC component of the measured AC value is subtracted from the measured DC signal to remove the DC component of the current flowing in the inductor.

Both $U_{DC}$ and $U_{AC}$ are sampled over a long period (e.g. one minute).

Besides using the calibration constant calculating the actual current, it also used as an indication of the overall system condition. The monitoring of this is done in the communication part.

After calculation of the actual currents and directions the measuring system takes care of the system specific calculations. These will vary from one implementation to another.

The invention claimed is:

1. An electric current measurement device, comprising:
    a housing defining a first open end and a second open end opposite said first open end;
    a first sealing element mounted in said first open end of said housing and having an aperture configured for receiving a first optical fibre;
    a first fixture element configured for fixing said first optical fibre in said housing;
    a first optical lens holder mounted in said housing, said first optical lens holder being configured for holding a first optical lens in said housing and having a first reception part configured for receiving said first fixture element for mounting said first optical fibre in optical continuation with said first optical lens;
    a first polarization filter mounted in said housing in optical continuation with said first optical lens;
    a glass rod received in and encapsulated within said housing in optical continuation with said first polarization filter, said glass rod being constructed from a material having magneto-optical properties;
    a second polarization filter mounted in said housing in optical continuation with said glass rod;
    a second optical lens holder mounted in said housing, said second optical lens holder being configured for holding a second optical lens in said housing in optical continuation with said second polarization filter, said second optical lens holder having a second reception part;
    a second fixture element configured for fixing a second optical fibre in said housing, said second fixture element being received in said second reception part of said second optical lens holder;
    a second sealing element mounted in said second end of said housing, said second sealing element having an aperture configured for receiving said second optical fibre; and
    first and second lids removably attachable to said first and second ends, respectively, of said housing, said first and second lids including an aperture configured for receiving said first and second optical fibres, respectively.

2. An electric current measurement device according to claim 1 wherein:
    said first and said second polarization filters are mounted in substantially parallel relation; and
    wherein the polarization planes of said first polarization filter and said second polarization filter are rotated 45°, respectively.

3. An electric current measurement device according to claim 1, wherein said glass rod is made from SF6.

4. An electric current measurement device according to claim 1, wherein said housing is made from a material exhibiting optical non-transparency within the range of at least 400 nm to 1000 nm.

5. An electric current measurement device according to claim 1, wherein said housing is made from a material selected from the group consisting of at least one of Ulterm and PEEK.

6. An electric current measurement device according to claim 1, said current measurement device further comprising:
    a groove in said housing, said groove formed in said housing and having a width corresponding to the length of said glass rod mounted in said housing, said groove being adapted for receiving an electrical conductor.

7. An electric current measurement device according to claim 1, said current measurement device further comprising:
    at least one wing extending from said housing, said wing being configured for enabling said housing to be mounted on an oblong electrical conductor.

8. A system for measuring high voltage current an electrical conductor, said system comprising:
    a light source;
    a first optical fibre configured for conducting light emitted from said light source;
    an optical electric current measurement device comprising:
        a housing defining a first open end and a second open end opposite said first open end;
        a first sealing element in said first open end of said housing and having an aperture configured for receiving said first optical fibre;
        a first fixture element configured for fixing said first optical fibre in said housing;
        a first optical lens holder mounted in said housing, said first optical lens holder being configured for holding a first optical lens in said housing and having a first reception part configured for receiving said first fixture element for mounting said first optical fibre in optical continuation with said first optical lens;
        a first polarization filter mounted in said housing in optical continuation with said first optical lens;
        a glass rod received in and encapsulated within said housing in optical continuation with said first polarization filter, said glass rod being constructed from a material having magneto-optical properties;
        a second polarization filter mounted in said housing in optical continuation with said glass rod;
        a second optical lens holder mounted in said housing and configured to hold a second optical lens in said housing in optical continuation with said second polarization filter, said second optical lens holder having a second reception part;
        a second fixture element configured for fixing a second optical fibre in said housing, said second fixture element being received in said second reception part of said second optical lens holder;
        a second sealing element mounted in said second end of said housing, said second sealing element having an aperture configured for receiving said second optical fibre; and
        first and second lids removably attachable to said first and second ends, respectively, of said housing, said first and second lids including an aperture configured for receiving, said first and second optical fibres, respectively, said optical electric current measurement device receiving said light from said first optical fibre, said second optical fibre receiving said light emitted from said optical electric current measurement device;
    a detection device operable for detecting said light emitted from said second optical fibre and converting said received light to an electrical signal; and
    a processing device operable for processing said electrical signal from said detection device so as to derive a measurement of said high voltage current in said electrical conductor.

9. The system of claim 8, further comprising a calibration system operable for calibrating the measurement of said current.

10. The system of claim 8, further comprising:
a centrally-located computer in communication with the processing device, the computer including an interface operable for communicating the status of the system to an operator.

11. The system of claim 8, wherein the computer is in communication with the processing device by a communications network selected from the group consisting of at least one of the Internet, a local area network, a wireless local area network, a wide area network, a global area network, a publicly switched telephone network, and a fixed wireless network.

* * * * *